United States Patent [19]

Haville

[11] 4,445,112

[45] Apr. 24, 1984

[54] POSITIONAL ENCODERS WITH PLUG-TOGETHER MODULES

[75] Inventor: George D. Haville, Santa Barbara, Calif.

[73] Assignee: BEI Electronics, Inc., San Francisco, Calif.

[21] Appl. No.: 216,069

[22] Filed: Dec. 12, 1980

[51] Int. Cl.³ .............................................. G08C 9/06
[52] U.S. Cl. ............................... 340/347 P; 361/413; 250/231 SE
[58] Field of Search .................... 340/347 P; 361/412, 361/413; 339/17 M; 250/231 SE

[56] References Cited

U.S. PATENT DOCUMENTS

| | | | |
|---|---|---|---|
| 3,247,505 | 4/1966 | Coyle | 340/347 P |
| 3,247,506 | 4/1966 | Grim | 340/347 P |
| 3,524,184 | 8/1970 | Brean | 340/347 P |
| 3,618,074 | 11/1971 | Brean | 340/347 P |
| 3,832,603 | 8/1974 | Cray | 361/413 |

OTHER PUBLICATIONS

Schupfner, "Funkschau", vol. 5, 1975, pp. 49–51.

Primary Examiner—C. D. Miller
Attorney, Agent, or Firm—Burmeister, York, Palmatier, Hamby & Jones

[57] ABSTRACT

An encoder for producing multidigit code word signals corresponding to the position and movement of a shaft or some other movable member, comprising a housing, a photocell board or some other signal producing board mounted on the housing and having photocell means or some other signal producing means including a multiplicity of signal channels for supplying a multiplicity of electrical signals indicating the position and movement of the code member, a plurality of circuit boards mounted on the housing in stacked relation to the signal producing board, the circuit boards including means for processing the signals from the signal producing means, and a multiplicity of sockets and pins mounted on the boards and plugged into one another for establishing electrical connections between the successive boards.

7 Claims, 23 Drawing Figures

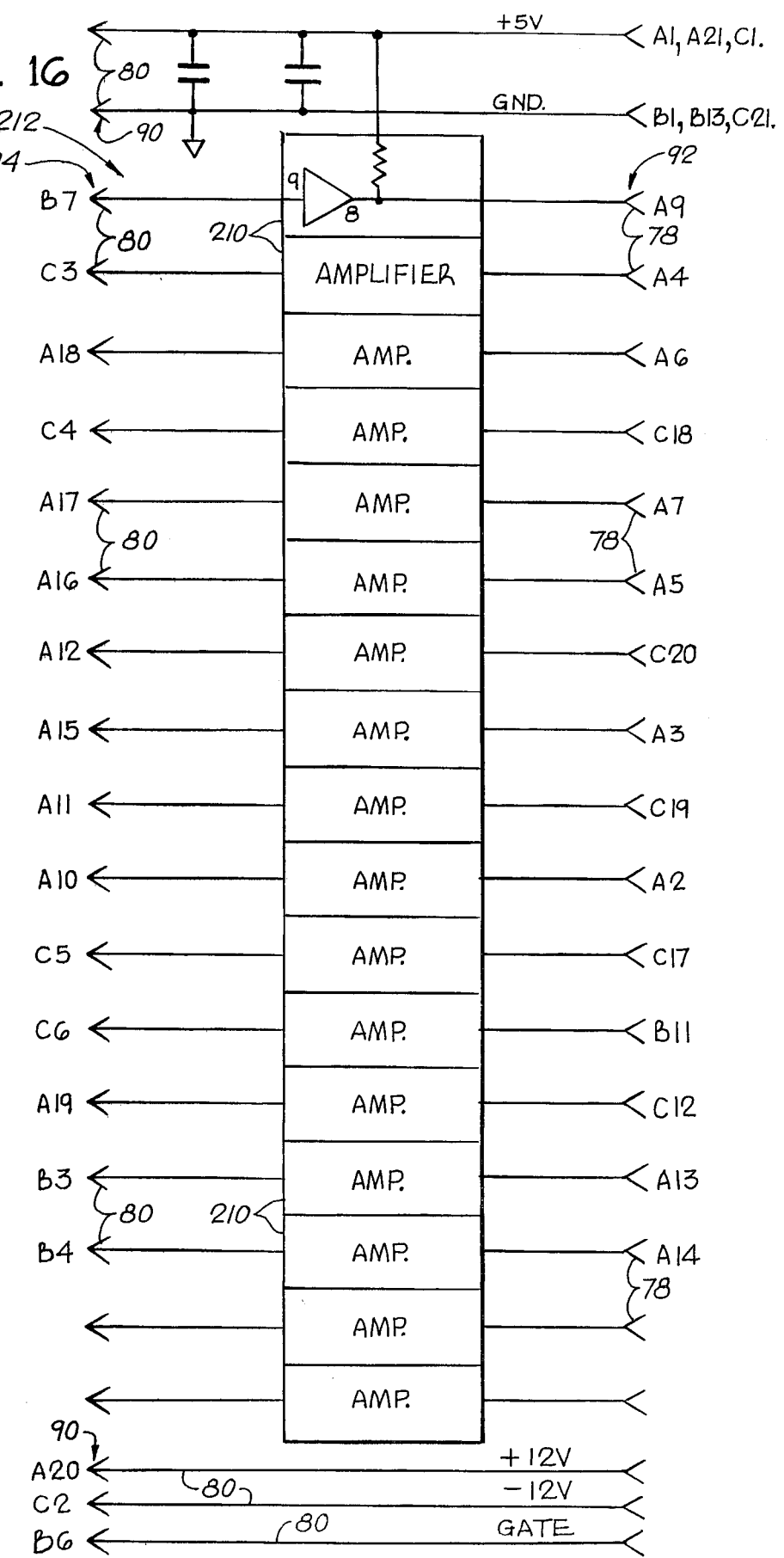

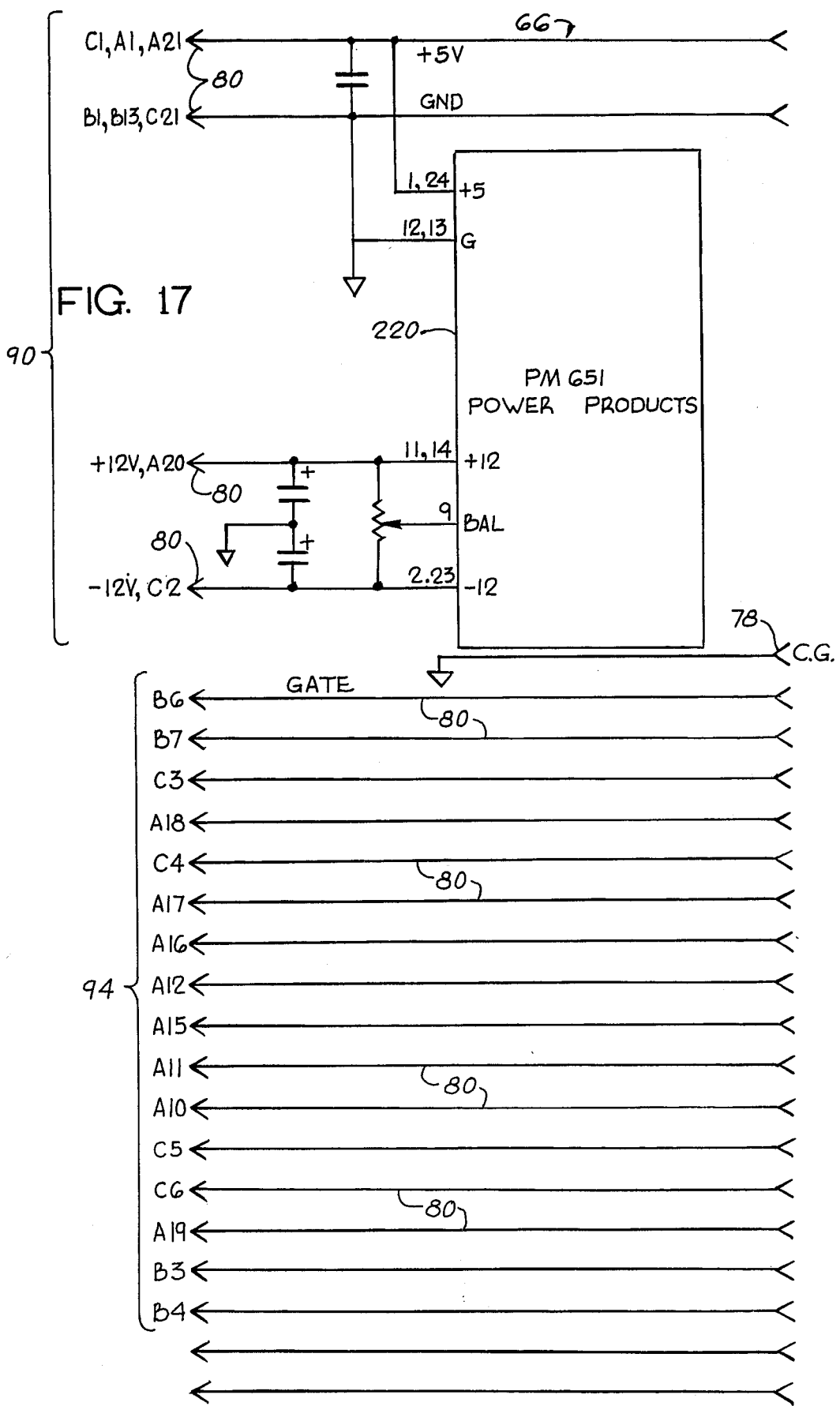

FIG. 19a.

INTERCONNECTION CHART
ENCODER TYPE:- 10 BIT NATURAL
122  202  WITH DRIVER

| BD PIN NO. | PHOTOCELL 13 BIT GRAY DIRECT | | CONVERTER 1 | | DRIVER 2 212 | | CONNECTOR | |
|---|---|---|---|---|---|---|---|---|
| | PIN | SOCKET ① | PIN | SOCKET ② | PIN | SOCKET | | |
| A1 | +5 | +5 | +5 | +5 | +5 | +5 | +5 | V |
| A2 | 9 | 9 | 9 | | | $2^0$ | $2^0$ | A |
| A3 | 7 | 7 | 7 | | | $2^2$ | $2^2$ | C |
| A4 | 1 | 1 | 1 | | | $2^8$ | $2^8$ | J |
| A5 | 5 | 5 | 5 | | | $2^4$ | $2^4$ | E |
| A6 | 2 | 2 | 2 | | | $2^7$ | $2^7$ | H |
| A7 | 4 | 4 | 4 | | | $2^5$ | $2^5$ | F |
| A8 | | | | | | | | |
| A9 | 0 | 0 | 0 | | | $2^9$ | $2^9$ | K |
| A10 | | | | $2^0$ | $2^0$ | | | |
| A11 | | | | $2^1$ | $2^1$ | | | |
| A12 | | | | $2^3$ | $2^3$ | | | |
| A13 | | | | | | | | |
| A14 | | | | | | | | |
| A15 | | | | $2^2$ | $2^2$ | | | |
| A16 | | | | $2^4$ | $2^4$ | | | |
| A17 | | | | $2^5$ | $2^5$ | | | |
| A18 | | | | $2^7$ | $2^7$ | | | |
| A19 | | | | | | | | |
| A20 | | | | | | | | |
| A21 | +5 | +5 | +5 | | | +5 | +5 | V |
| b1 | G | G | G | | | G | G | T |
| b2 | | | | | | | | |
| b3 | | | | | | | | |
| b4 | | | | | | | | |
| b5 | | | | | | | | |
| b6 | | | | $2^9$ | $2^9$ | | | |
| b7 | | | | | | | | |

FIG. 18a.

INTERCONNECTION CHART
ENCODER TYPE :-
122 — 13 BIT GRAY DIRECT

| BD PIN NO. | PHOTOCELL 13 BIT GRAY DIRECT | | CONNECTOR | |
|---|---|---|---|---|
| | PIN | SOCKET ① | ② | |
| A1 | | +5 | | V |
| A2 | | 9 | G3 | D |
| A3 | | 7 | G5 | F |
| A4 | | 1 | G11 | M |
| A5 | | 5 | G7 | H |
| A6 | | 2 | G10 | L |
| A7 | | 4 | G8 | J |
| A8 | | 11 | G1 | B |
| A9 | MSb | 0 | G12 | N |
| A10 | | | | |
| A11 | | | | |
| A12 | | | | |
| A13 | | | | |
| A14 | | | | |
| A15 | | | | |
| A16 | | | | |
| A17 | | | | |
| A18 | | | | |
| A19 | | | | |
| A20 | | | | |
| A21 | | +5 | | V |
| b1 | | G | | T |
| b2 | | | | |
| b3 | | | | |
| b4 | | | | |
| b5 | | | | |
| b6 | | | | |
| b7 | | | | |

FIG. 19b

| | | | | | | |
|---|---|---|---|---|---|---|
| b8 | | | | | | |
| b9 | | | | | | |
| b10 | | | | | | |
| b11 | | | | | | |
| b12 | | | | | | |
| b13 | T | | | | | |
| C1 | V | | | | | |
| C2 | G | G | G | G | G | G |
| C3 | +5 | +5 | +5 | +5 | +5 | b |
| C4 | | | $2^8$ | $2^8$ | | D |
| C5 | | | $2^6$ | $2^6$ | | T |
| C6 | | | | | | S |
| C7 | | | | | | |
| C8 | | | | | | |
| C9 | | | | | | |
| C10 | | | | | | |
| C11 | | | | | | |
| C12 | | | | | | |
| C13 | | | | | | |
| C14 | | | | | | |
| C15 | | | | | | |
| C16 | | | | | | |
| C17 | | | | | | |
| C18 | 3 | 3 | | | | G |
| C19 | 8 | 8 | | | $2^0$ | $2^0$ |
| C20 | 6 | 6 | | | $2^1$ | $2^1$ |
| C21 | G | G | G | G | $2^3$ | $2^3$ |
| | | | | | G | G |
| | | | | | CG | S |

1. TRACK COUNT (RESOLUTION)
2. BIT WORD ORDER (OPPOSITE FROM TRACK RESOLUTION)

FIG. 18b

| | |
|---|---|
| b8 | |
| b9 | |
| b10 | |
| b11 | |
| b12 | |
| b13 | T |
| C1 | V |
| C2 | G |
| C3 | +5 |
| C4 | |
| C5 | |
| C6 | |
| C7 | |
| C8 | |
| C9 | |
| C10 | |
| C11 | |
| C12 | |
| C13 | |
| C14 | |
| C15 | |
| C16 | LSB |
| C17 | 12 |
| C18 | 10 A |
| C19 | 3 G0 C |
| C20 | 8 G2 K |
| C21 | 6 G9 E |
| | 6 G4 G |
| | G G6 T |
| | G G |

1. TRACK COUNT (RESOLUTION) (EXAMPLE: 7 = $2^7$ GRAY COUNTS FROM DISC)
2. BIT WORD ORDER (EXAMPLE: G3 = GRAY CODE $2^3$ IN WORD ORDER, OPPOSITE FROM TRACK RESOLUTION)

FIG. 20a

INTERCONNECTION CHART
ENCODER TYPE – 15 BIT NATURAL WITH LATCH AND DRIVER

| BD / PIN NO. | PHOTOCELL SIN+COS +11 BIT 52 | | 2X MULTIPLIER 54 | | PHASE SPLITTER 56 | | LOGIC 58 | | GATE 1 60 | | CONVERTER 2 62 | | DRIVER 64 | | POWER SUPPLY 66 | | CONNECTOR 72 |
|---|---|---|---|---|---|---|---|---|---|---|---|---|---|---|---|---|---|
| | PIN | SOCKET | PIN | SOCKET | PIN | SOCKET | PIN | SOCKET | PIN | SOCKET | PIN | SOCKET | PIN | SOCKET | PIN | SOCKET | |
| A1 | | +5 | +5 | | +5 | | +5 | | +5 | | +5 | | +5 | | +5 | | +5  V |
| A2 | | 9 | 9 | | 9 | | 9 | | 9 | | 9 | | | | | | |
| A3 | | 7 | 7 | | 7 | | 7 | | 7 | | 7 | | | | | | |
| A4 | | – | – | | – | | – | | – | | – | | | | | | |
| A5 | | 5 | 5 | | 5 | | 5 | | 5 | | 5 | | | | | | |
| A6 | | 2 | 2 | | 2 | | 2 | | 2 | | 2 | | | | | | |
| A7 | | 4 | 4 | | 4 | | 4 | | 4 | | 4 | | | | | | |
| A8  LSB | | S11 | S11 | | | | | | | | | | | | | | |
| A9  MSB | | 0 | 0 | | 0 | | 0 | | 0 | | 0 | | | | | | |
| A10 | | | | S12 | 22° | S12 | 22° | | | | | | | | | | |
| A11 | | | | | N45° | | N45° | | | | | | | | | | |
| A12 | | | | | | | | | | | | | | | | | |
| A13 | | | | | | | | NC13 | | | | | | | | | |
| A14 | | | | | | | | NC14 | | | | | | | | | |
| A15 | | | | | | | | | 7 | 7 | 7 | | $2^5$ | $2^5$ | $2^5$ | $2^5$ | $2^5$  H |
| A16 | | | | | | | | | 5 | 5 | 5 | | $2^7$ | $2^6$ | $2^6$ | $2^6$ | $2^6$  K |
| A17 | | | | | | | | | 4 | 4 | 4 | | $2^{13}$ | $2^8$ | $2^8$ | $2^8$ | $2^8$  L |
| A18 | | | | | | | | | 2 | 2 | 2 | | $2^9$ | $2^7$ | $2^7$ | $2^7$ | $2^7$  N |
| A19 | | | | | | | | | 12 | 12 | 12 | | $2^{12}$ | $2^9$ | $2^9$ | $2^9$ | $2^9$  C |
| A20 | | | | +12 | | +12 | | +12 | | +12 | +12 | | $2^{10}$ | $2^{10}$ | $2^{10}$ | $2^{10}$ | $2^{10}$  V |
| A21 | | +5 | +5 | | +5 | | +5 | | +5 | | +5 | | $2^{12}$ | $2^{12}$ | $2^{12}$ | +5 | +5  T |
| B1 | | G | G | | G | | G | | G | | G | | $2^2$ | $2^2$ | $2^2$ | G | G |
| B2 | | | | | | | | | | | 13 | 13 | | | | | $2^1$  B |
| B3 | | | | | | | | | | | 14 | 14 | $2^1$ | $2^1$ | $2^1$ | $2^1$ | $2^1$  A |
| B4 | | | | | | | | | | | | | $2^0$ | $2^0$ | $2^0$ | $2^0$ | $2^0$ |
| B5 | | | | | | | | | GATE | GATE | GATE | | GATE | GATE | GATE | GATE | GATE  U |
| B6 | | | | | | | | | 0 | 0 | 0 | | $2^{14}$ | $2^{14}$ | $2^{14}$ | $2^{14}$ | $2^{14}$  R |
| B7 | | | | | | | | | | | | | | | | | |

FIG. 20b

| | | | | | | | | | | |
|---|---|---|---|---|---|---|---|---|---|---|
| B8 | | | | | | | | | | |
| B9 | | | | | | | | | | |
| B10 | | C11A | | | | | | | | |
| B11 | | | | NC11 | | | | | | |
| B12 | | | | | | | | | | |
| B13 | | | | | | | | | | T |
| C1 | G +5 | G +5 | G +5 | G +5 | G +5 | G +5 | G +5 | G +5 | | V |
| C2 | -1 | -12 | -12 | -12 | -12 | -12 | -12 | -12 | | |
| C3 | | | | | | | | $2^{13}$ | $2^{13}$ | P |
| C4 | | | | | 1 | | | $2^{11}$ | $2^{11}$ | M |
| C5 | | | | | 3 | | | $2^4$ | $2^4$ | E |
| C6 | | | | | 10 | | | $2^3$ | $2^3$ | D |
| C7 | BRS | BRS | BRS | | 11 | | | | | |
| C8 | | | | | | | | | | |
| C9 | | | | | | | | | | |
| C10 | | | | | | | | | | |
| C11 | | | C12 | C12 | | | $2^2$ | $2^2$ | | |
| C12 | | | | 0° | NC12 | 12 | | | | |
| C13 | | | | 135° | 135° | | | | | |
| C14 | | | | 112° | 112° | | | | | |
| C15 | | | | 157° | 157° | | | | | |
| C16 | LSB | | | | | | | | | |
| C17 | C11 | C11 | | | 10 | 10 | | | | |
| C18 | 10 | 10 | | | 3 | 3 | $2^4$ | $2^4$ | | |
| C19 | 3 | 3 | | | 8 | 8 | $2^{11}$ | $2^{11}$ | | |
| C20 | 8 | 8 | | | 6 | 6 | $2^6$ | $2^6$ | | |
| C21 | 6 | 6 | | | G | G | $2^8$ | $2^8$ | G | T |
| | G | G | | | | | G | G | | |

CG S

1 TRACK COUNT (EXAMPLE: $7 = 2^7$ GRAY FROM TRACK RESOLUTION)
2 BIT WORD ORDER (OPPOSITE FROM TRACK RESOLUTION)
3. S = SINE    C = COSINE
4. N = NOT (EXAMPLES: N45 = NOT 45°.  NC14 = NOT COSINE $2^{14}$ TRACK RESOLUTION DIGITAL)
5. UNDER COLUMNS LABELED PIN, A PIN SOCKET IS INSTALLED.
   UNDER COLUMNS LABELED SOCKET, A SOCKET ONLY IS INSTALLED.

POSITIONAL ENCODERS WITH PLUG-TOGETHER MODULES

FIELD OF THE INVENTION

This invention relates to encoders for producing multi-digit code word electrical signals corresponding to the position and movement of a rotatable shaft or some other movable input member. The invention is particularly applicable to shaft angle encoders of the optical type, having a rotatable optical code disc or other member, with a multiplicity of tracks for modulating light from one or more light sources, the modulated light being converted into electrical signals by multitrack photocell means having a multiplicity of output channels for supplying multidigit code word electrical signals, and also sine and cosine signals, in some instances. Such optical encoders may include one or more circuit boards or other modules for processing the electrical signals.

OBJECTS OF THE INVENTION

One object of the present invention is to provide a new and improved encoder of the foregoing character, having a plurality of boards or modules which plug together in an ingenious manner, so that many different encoder configurations can be produced by plugging together a series of different modules selected from a set of standard modules.

In this way, a wide variety of encoders having various characteristics can be produced very readily by assembling a selection of standard modules. For example, the number of digits in the output code word signals can be selected, according to the resolution requirements of the encoder. Moreover, various codes can be selected, such as the Gray code, the natural binary code, or the binary coded decimal system, for example. Furthermore, a selection can be made of a single ended output or a balanced output. In addition, a selection of various output connectors can readily be made.

A more specific object is to provide a new and improved encoder of the foregoing character, having modules which are provided with pins and sockets arranged in an ingenious manner, to transmit the electrical code signals, and also the voltages and control signals between the modules.

SUMMARY OF THE INVENTION

To achieve these and other objects, the invention preferably provides an encoder comprising a housing, a code member movably mounted in the housing, signal producing means including a multiplicity of signal channels for supplying a multiplicity of electrical signals indicating the movement of the code member, a plurality of circuit modules mounted on the housing in stacked relation, the circuit modules including means for processing the signals from the signal producing means, and a multiplicity of sockets and pins mounted on the modules and plugged into one another for establishing electrical connections between the successive modules, each of the modules having a multiplicity of matching positions for selectively receiving the sockets and pins, the modules having a common connection group comprising a plurality of the positions for receiving sockets and pins to establish certain electrical connections extending in common to the stacked modules, the common connection group including electrical connections for supplying electrical power to the stacked modules, the modules including a plurality of signal channel groups of said positions for receiving sockets and pins for transmitting the multiplicity of electrical signals between the modules, the signal channel groups being employed alternatively to carry the signals to and from certain of the modules.

Certain of the pins and sockets are preferably combined into pin/sockets which plug into other sockets and are adapted to receive other pins, to supply signals and voltages to the associated modules, while also carrying the signals and voltages to the adjacent modules.

Certain of the modules may include signal modifying means having a set of input connections and a distinct set of output connections, the signal channel groups including one signal channel group comprising sockets and pins for supplying input signals to the input signal connections, the signal channel groups also including another signal channel group comprising sockets connected to the output signal connections.

The modules are preferably in the form of boards on which the pins and sockets are mounted in selected positions.

The encoder is preferably of the optical type, in which the code member is in the form of an optical code member having a multiplicity of tracks for modulating light from a light source, the signal producing means preferably being in the form of multitrack photocell means for receiving the modulated light from the code member, the photocell means having a multiplicity of signal channels for supplying a multiplicity of electrical signals indicating the movement of the optical code member. One of the boards may be a photocell supporting board which preferably includes a plurality of sockets for receiving pins on the adjacent board.

The common connection group preferably includes an electrical connection for supplying a control signal to certain of the boards. Such control signal may be a gating signal, for example.

A variety of boards or modules may be provided, having various signal modifying means, such as a set of amplifiers for amplifying the signals, a set of gates for gating the signals, a plurality of logic elements, a system of logic elements for converting the signals between Gray code and natural binary code, multiplier means for multiplying the frequency of certain of the signals, or phase splitter means for splitting certain of the signals into phase split signals, for example.

A plurality of posts may be connected between the stacked boards, to afford support therebetween.

The encoder may include a connector having a multiplicity of contacts, one of the boards serving as an output board, the common connection group including a plurality of sockets on the output board and means connecting the last mentioned sockets to certain contacts of the connector, one of the signal channel groups including a plurality of sockets on the output board and means connecting the last mentioned sockets to other contacts of the connector.

BRIEF DESCRIPTION OF THE DRAWINGS

Further objects, advantages and features of the present invention will appear from the following description, taken with the accompanying drawings, in which:

FIG. 16 is a schematic circuit diagram of a second or modified driver board, similar to the driver board of FIG. 15, except that the two groups of signal channels are reversed between the input and the output.

FIG. 17 is a schematic circuit diagram of a power supply board.

FIGS. 18a and 18b, taken together, constitute an interconnection chart for an illustrative encoder comprising a photocell board and an output connector for producing thirteen bit Gray code electrical signals.

FIGS. 19a and 19b, taken together, constitute another interconnection chart for another illustrative encoder comprising a photocell board, a converter board, a driver board, and a connector, for producing ten bit natural binary code word electrical signals.

FIGS. 20a and 20b, taken together, constitute an interconnection chart for another illustrative encoder utilizing a photocell board, a multiplier board, a phase splitter board, a logic board, a gate board, a converter board, a driver board, a power supply board and a connector, for producing fifteen bit natural binary code word electrical signals.

DETAILED DESCRIPTION OF ILLUSTRATIVE EMBODIMENTS

Figure 1:
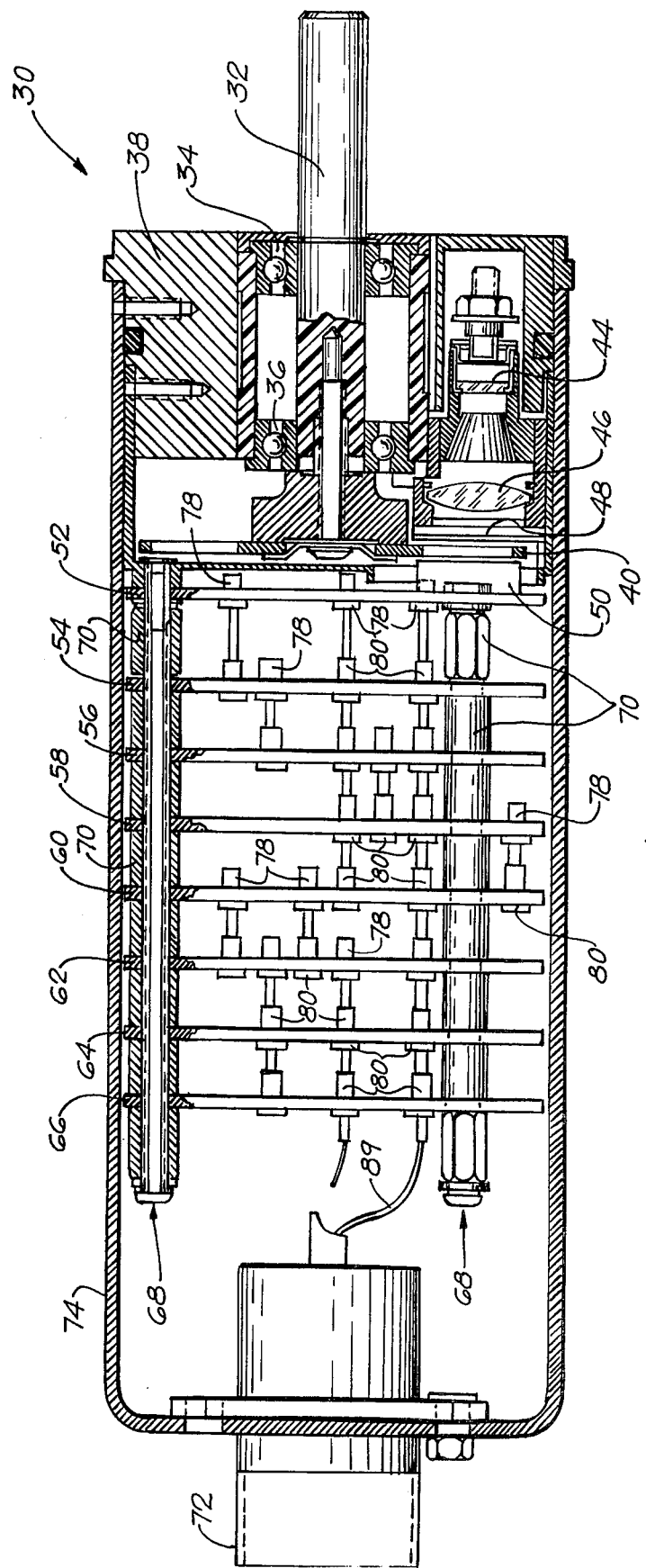
FIG. 1 is a semi-diagrammatic longitudinal section of an optical encoder to be described as an illustrative embodiment of the present invention.

As just indicated, FIG. 1 illustrates an encoder 30 for producing multidigit code word electrical signals corresponding to the position or movement of an input member. The illustrated encoder is of the shaft angle type, and is also of the optical type, although the present invention is applicable to other types of encoders.

As illustrated in FIG. 1, the optical encoder 30 has an input member in the form of a rotatable shaft 32 which is supported by bearings 34 and 36 in a housing or frame 38. The general purpose of the encoder 30 is to produce electrical signals which indicate the position or movement of the shaft 32 with a high degree of precision. Thus, the encoder 30 may be used in a telemetering system for electrically monitoring the position or movement of any rotatable or translatable member, to which the shaft 32 is connected.

The optical encoder 30 has a movable code member, illustrated as an optical code disc 40, mounted on and rotatable with the mechanical input shaft 32. The optical code disc 40 may be of any known or suitable construction, and preferably is of the multitrack type, having a plurality of optical code tracks 42 for modulating light in accordance with the position or movement of the code disc 40. Such optical code discs are well known to those skilled in the art. For example, a typical code disc may be of the digital type, made of a transparent material, such as glass, and provided with a plurality of concentric circular tracks, each of which has successive segments or divisions which are alternately light and dark, so that incident light is modulated by the track when the disc is rotated. The number of divisions or cycles in the successive concentric tracks may differ in accordance with a binary code. Thus, for example, the number of cycles or divisions in the successive tracks may be 1, 2, 4, 8, 16, 32 and so forth. The number of divisions or cycles may be represented by successive powers of 2: $2^0$, $2^1$, $2^2$, $2^3$, $2^4$, $2^5$ and so forth. The code disc 40 may be arranged to either transmit or reflect light. In some cases, the code disc 40 may have sine and cosine tracks, in addition to the digital code tracks. The sine and cosine tracks are generally of a higher order of resolution or cycle count.

By way of example, optical code discs of the foregoing character are illustrated and described in the following U.S. patents: Brean and Stiedle U.S. Pat. No. 3,618,074, issued Nov. 2, 1971, and the Brean U.S. Pat. No. 3,710,375, issued Jan. 9, 1973, both of which are assigned to the assignee of the present invention.

As shown in FIG. 1, the optical code disc 40 is illuminated by a light source 44, illustrated as a light emitting diode. A collimating lens 46 and an objective lens 48 are provided to focus the light in a fine line on the tracks 42 of the code disc 40.

As shown in FIG. 1, the encoder 30 includes a multichannel photodetector or photocell means 50 for converting the modulated light from the code tracks 42 on the code disc 40 into a plurality of corresponding electrical signals. The multichannel photodetector 50 is positioned closely adjacent the optical code disc 40 for receiving the modulated light from the code tracks 42.

The multichannel photodetector 50, as shown in FIG. 1, is mounted on and is a component of a photocell board or module 52, which in turn is mounted on the housing 38. The photocell board 52 produces a multiplicity of electrical signals which may define a variable multidigit code word, identifying or indicating the angular position of the code disc 40. The signals from the photocell board 52 may also include sine and cosine signals, in some instances.

The encoder 30 of FIG. 1 also includes a plurality of circuit boards for processing or modifying the signals from the photocell board 52. Seven such circuit boards 54, 56, 58, 60, 62, 64 and 66 are provided in the illustrated encoder 30. The boards or modules 52–66 are assembled in a stacked relationship, as shown in FIG. 1. Post assemblies 68 may be employed to provide mechanical support for the stacked boards 52–66, three such post assemblies 68 being utilized in the present case. The post assemblies 68 may include spacers 70 between the successive boards 52–66.

Figure 2:
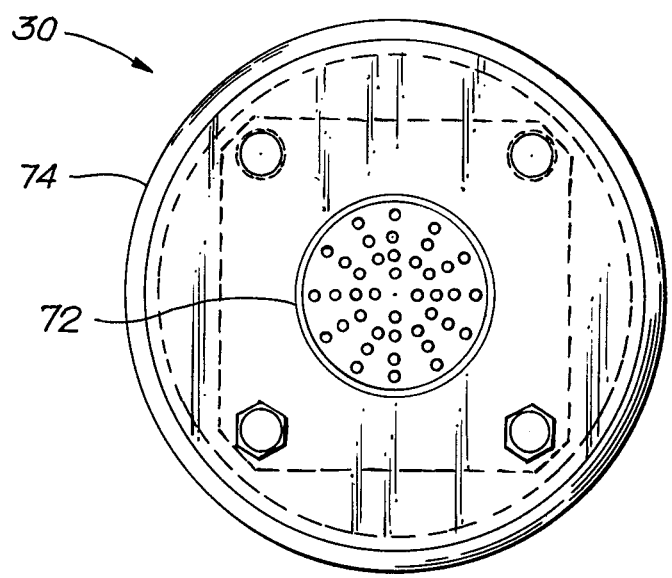
FIG. 2 is an end view showing the connector end of the encoder of FIG. 1.

As shown in FIGS. 1 and 2, a multicontact electrical connector 72 may be employed to establish a multiplicity of electrical connections to the boards or modules 52–66 of the encoder 30, and also to the light source 44. As shown, the connector 72 is mounted on a shell 74 which encloses the boards 52–66 and is removably mounted on the housing 38. The shell 74 is preferably made of metal to serve as an electrical shield around the boards 52–66.

Figure 3:
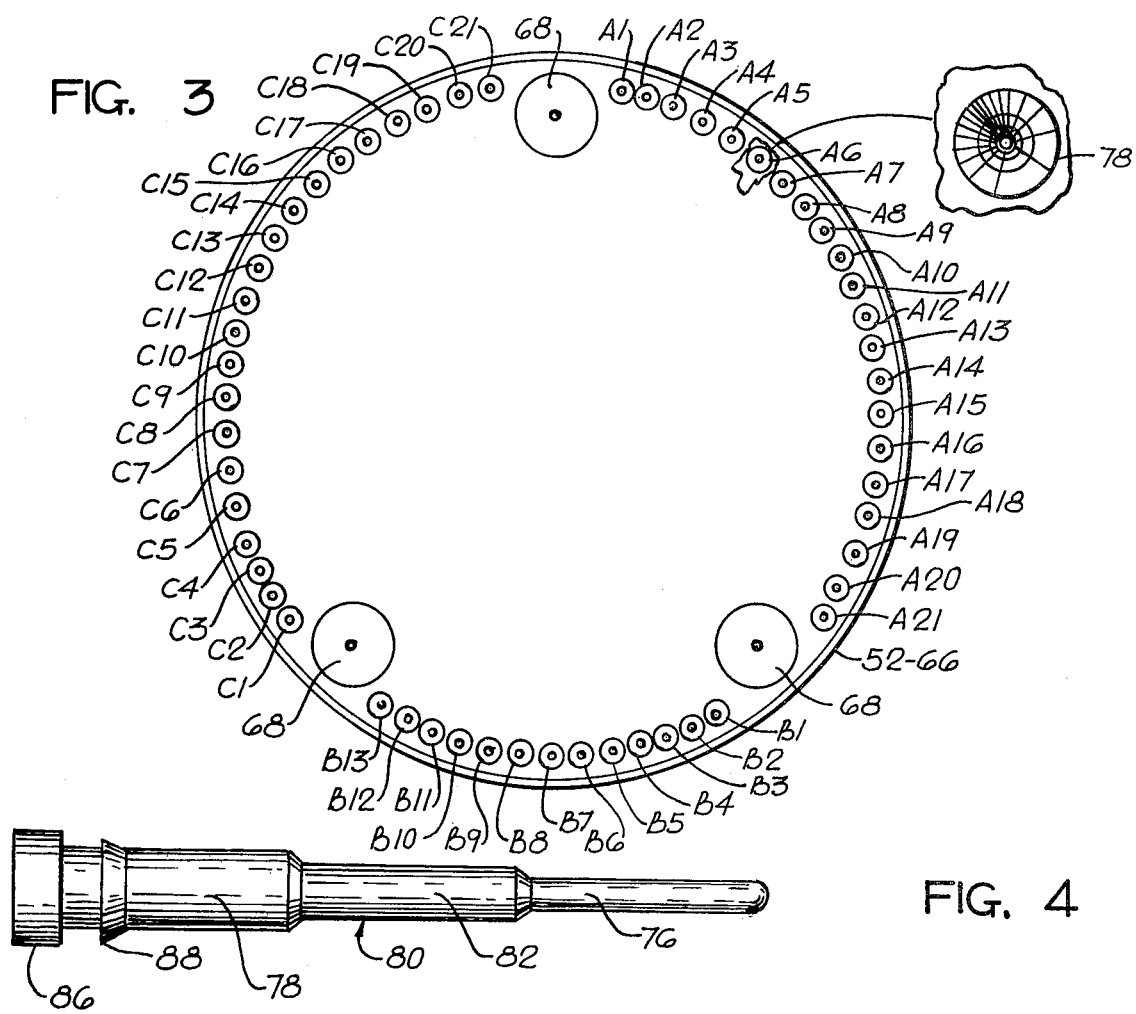
FIG. 3 is a diagrammatic view of one of the boards or modules for the encoder, showing the matched or standard positions for the pins and sockets which are employed to transmit signals and voltages between the various boards of the encoder.
Figure 4:
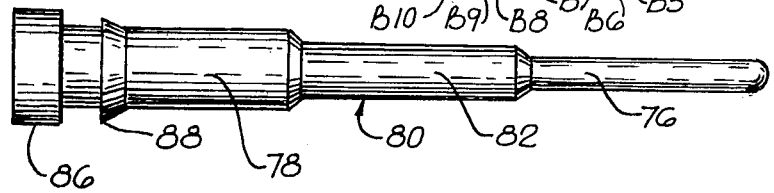
FIG. 4 is an enlarged side view of one of the pin/sockets for the encoder.
Figure 5:
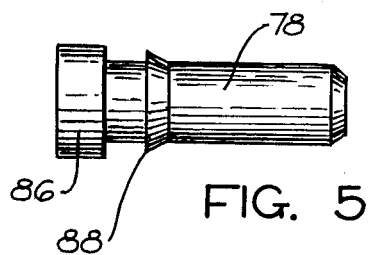
FIG. 5 is an enlarged side view of one of the sockets for the encoder.
Figure 6:
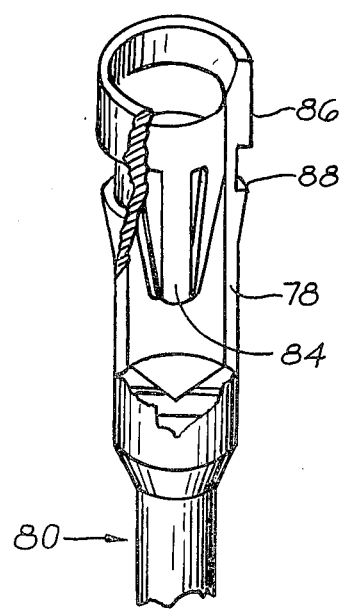
FIG. 6 is a fragmentary enlarged cutaway perspective view of one of the pin/sockets.

In the encoder 30 of FIGS. 1–6, the various boards or modules 52–66 are connected together electrically by contact elements which plug together, so that it is extremely easy to assemble the boards. Moreover, a wide variety of boards or modules can be employed interchangeably, to produce encoders having many different characteristics and operating specifications. The individual contact elements may assume various forms. As shown in FIGS. 4, 5 and 6, the contact elements may be in the form of pins or prongs 76 and sockets or receptacles 78. Other forms of male and female contact elements may be employed. Some of the sockets 78 may be in the form of separate elements, as illustrated in FIG. 5, while other sockets 78 may be combined with the pins 76 to form pin/sockets 80, as shown in FIG. 4. Each of the pin/sockets 80 has one of the pins 76 at one end and one of the sockets 78 at the other end, with a spacer element 82 therebetween. Pins 76, sockets 78 and spacers 82 may be made of metal so as to be electrically conductive. As shown in FIG. 6, the sockets 78 may have spring fingers 84 for engaging and gripping the pins 76.

The various boards or modules 52–66 of the encoder 30 may be provided with a large number of the sockets 78 and pin/sockets 80. It will be understood that the sockets 78 and pin/sockets 80 are mounted in holes formed in the individual boards 52–66. It will be seen that each socket 78 has an enlarged head 86 adapted to engage one side of one of the boards 52–66. Each socket 78 has a barb or shoulder 88, adapted to retain the socket in its hole in one of the boards.

As shown in FIG. 3, each of the boards or modules 52–66 has a large number of standardized or matching positions in which the sockets 78 or pin/sockets 80 may be mounted. Generally speaking, only some of the standard positions are employed for any particular board. In the construction represented by FIG. 3, there are 55 standard positions for the sockets 78 and the pin/sockets 80. These 55 positions are numbered A1 through A21, B1 through B13, and C1 through C21. The 55 positions are spaced in a circular pattern. In this case, the boards or modules 52–66 are circular in shape. It will be understood that sockets 78 or pin/sockets 80 may be mounted in any of the 55 standard positions.

Sample positions of some of the sockets 78 and pin/sockets 80 are shown in FIG. 1. It will be seen that all of the sockets 78 face away from the shaft end of the encoder 30 and toward the connector end. The pins 76 project toward the shaft end of the encoder 30 and are adapted to be received in corresponding sockets 78 in the adjacent boards. Only sockets 78 are employed on the photocell board 52. However, both sockets 78 and pin/sockets 80 may be employed on the other boards 54–66.

For a better understanding of the interconnections between the various boards 52–66 of the encoder 30, it will be advantageous to describe various details of the individual boards. Schematic circuit diagrams of the boards 52–66 are shown in the drawings, as will be described presently. The interconnections between the boards 52–66 are shown in the chart or table of FIGS. 20a and 20b.

Figure 7:
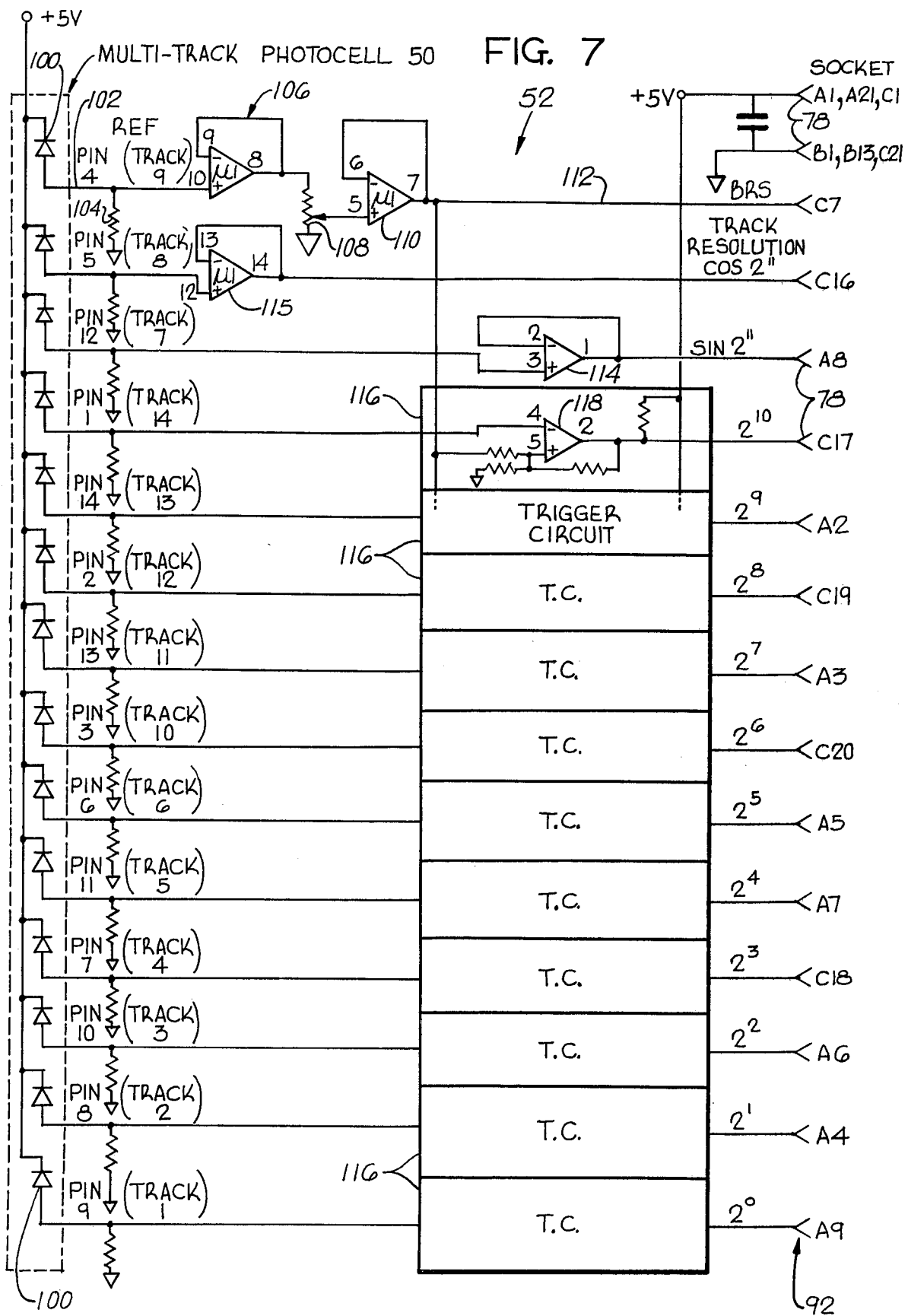
FIG. 7 is a schematic circuit diagram of a photocell board which produces eleven bit code word signals plus sine and cosine signals of the next higher order of resolution.

Briefly, the board or module 52 is a multichannel photocell board, shown in FIG. 7, which produces a multiplicity of electrical signals corresponding to an 11-bit binary code word plus sine and cosine signals of the next higher order.

Figure 9:
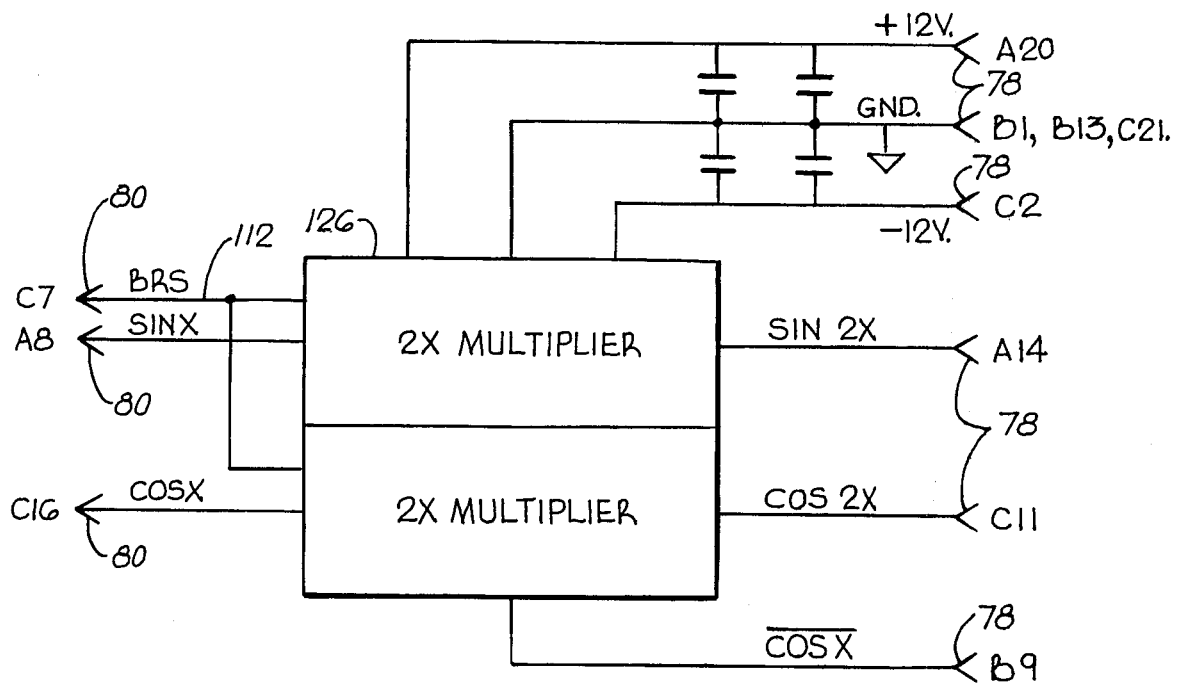
FIG. 9 is a schematic circuit diagram of a multiplier circuit board for multiplying the frequency of the sine and cosine signals by a factor of 2.
Figure 9:
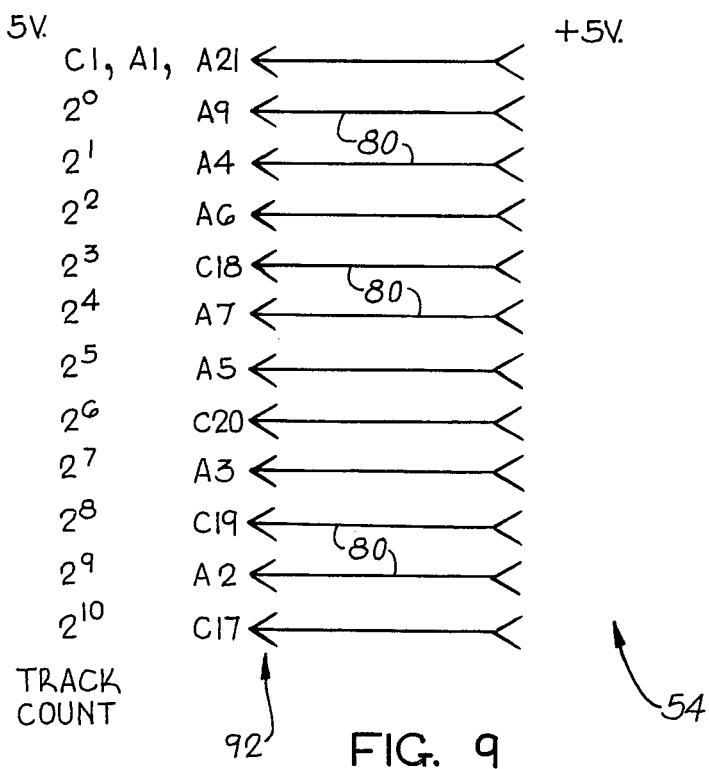

The board or module 54, shown in FIG. 9, is a frequency multiplier board which utilizes the sine and cosine signals to produce additional sine and cosine signals having twice the frequency of the original sine and cosine signals from the board 52. The 11-bit digital signals are simply transmitted through the board 54, without change.

Figure 10:
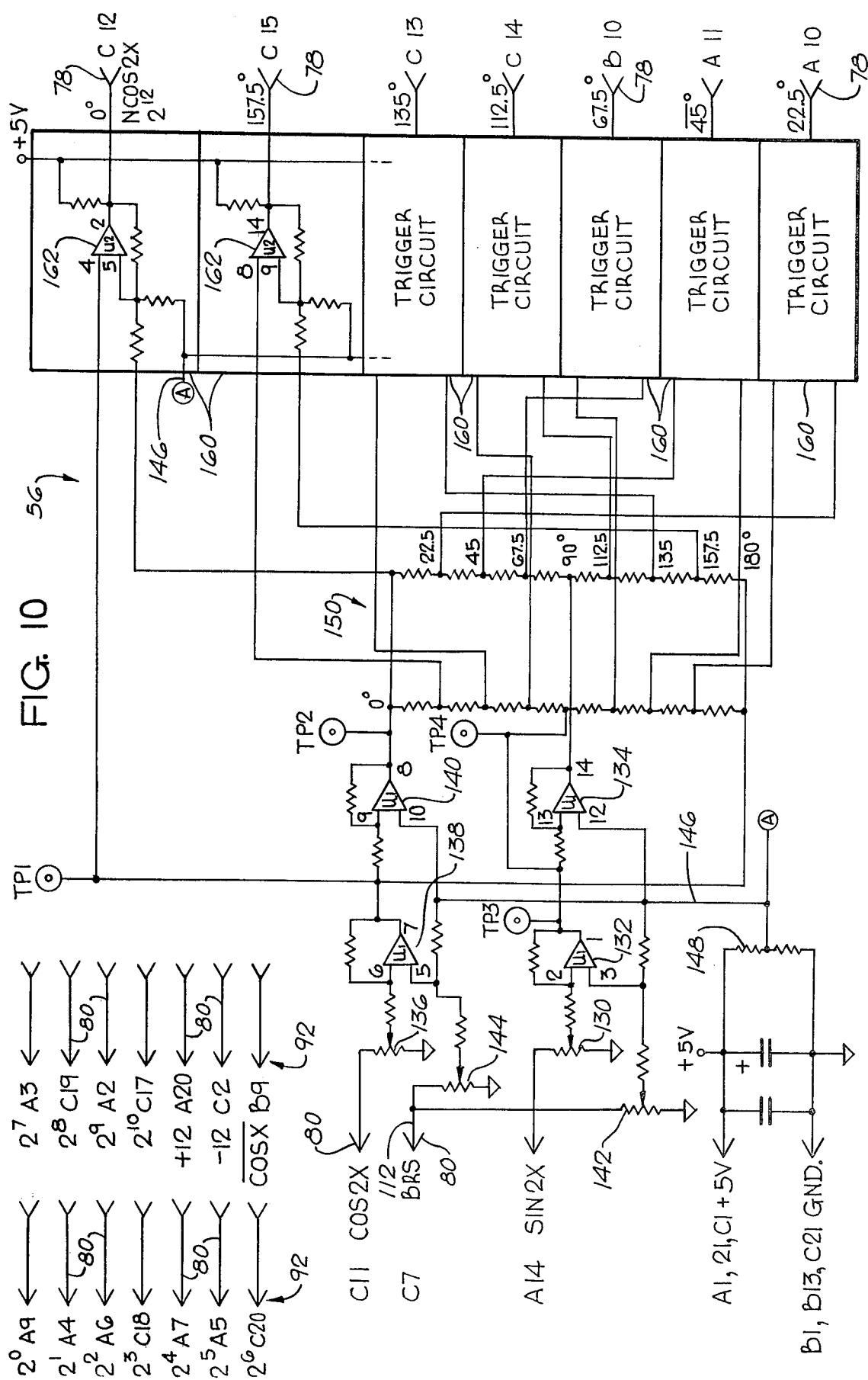
FIG. 10 is a schematic circuit diagram of a phase splitter board which converts sine and cosine signals into phase split signals at regular intervals of 22.5°.

The circuit board or module 56, shown in FIG. 10, is a phase splitting board which utilizes the double frequency sine and cosine signals, designated sin 2x and cos 2x, from the board 54, to produce phase split signals at phase angles of 22.5°, 45°, 67.5°, 112.5°, 135°, and 157.5°. The 11-bit digital signals are simply transmitted through the board 56, without change.

Figure 11:
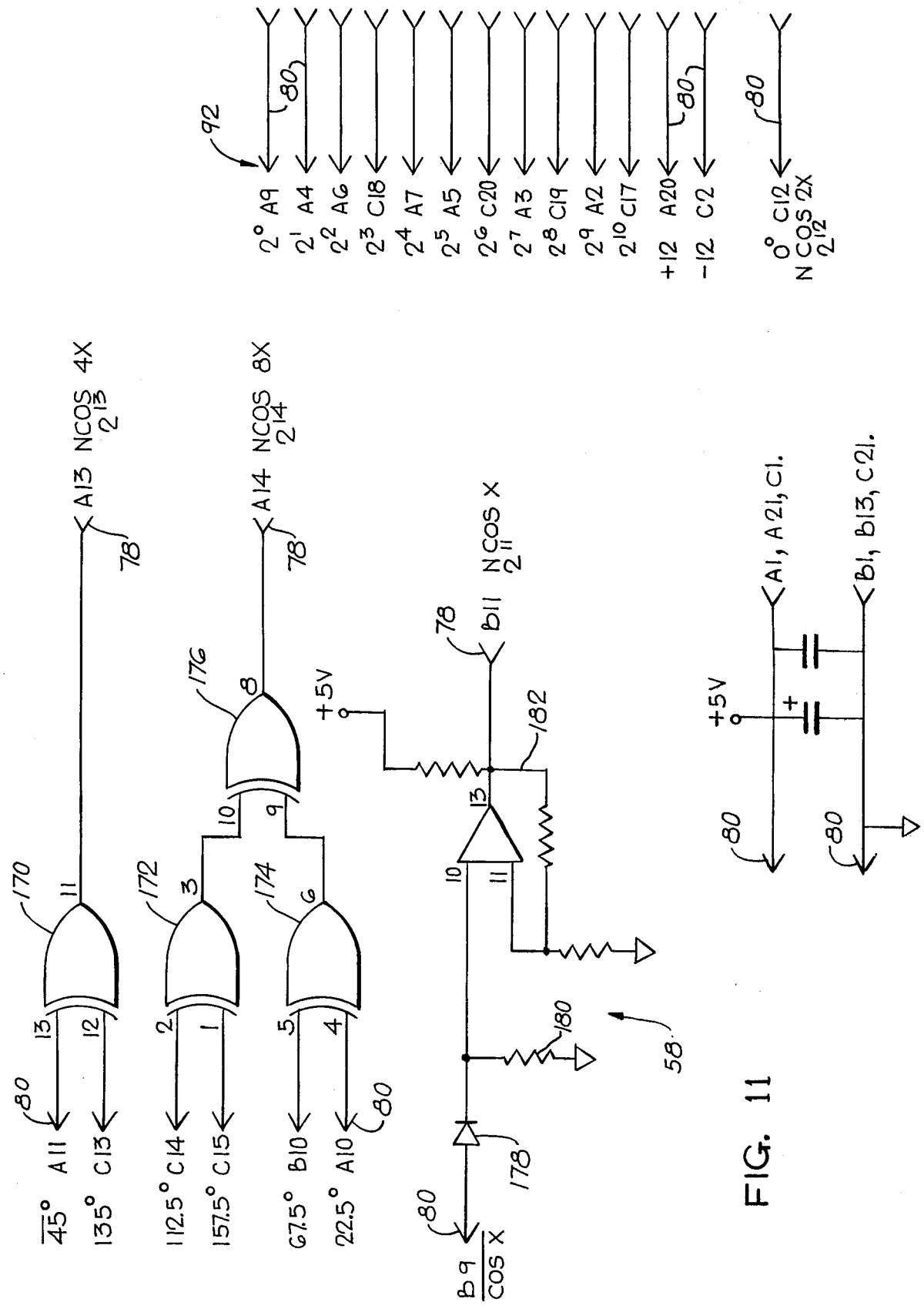
FIG. 11 is a schematic circuit diagram of a logic board for converting the phase split signals into higher order signals.

The board or module 58, shown in FIG. 11, is a logic board which combines the phase split signals from the board 56 to produce two additional bits for the code word. The original 11-bit signals are simply transmitted through the board 58 without change. The electrical output signals from the logic board 58 provide a 15-bit digital code word, utilizing the Gray code.

Figure 12:
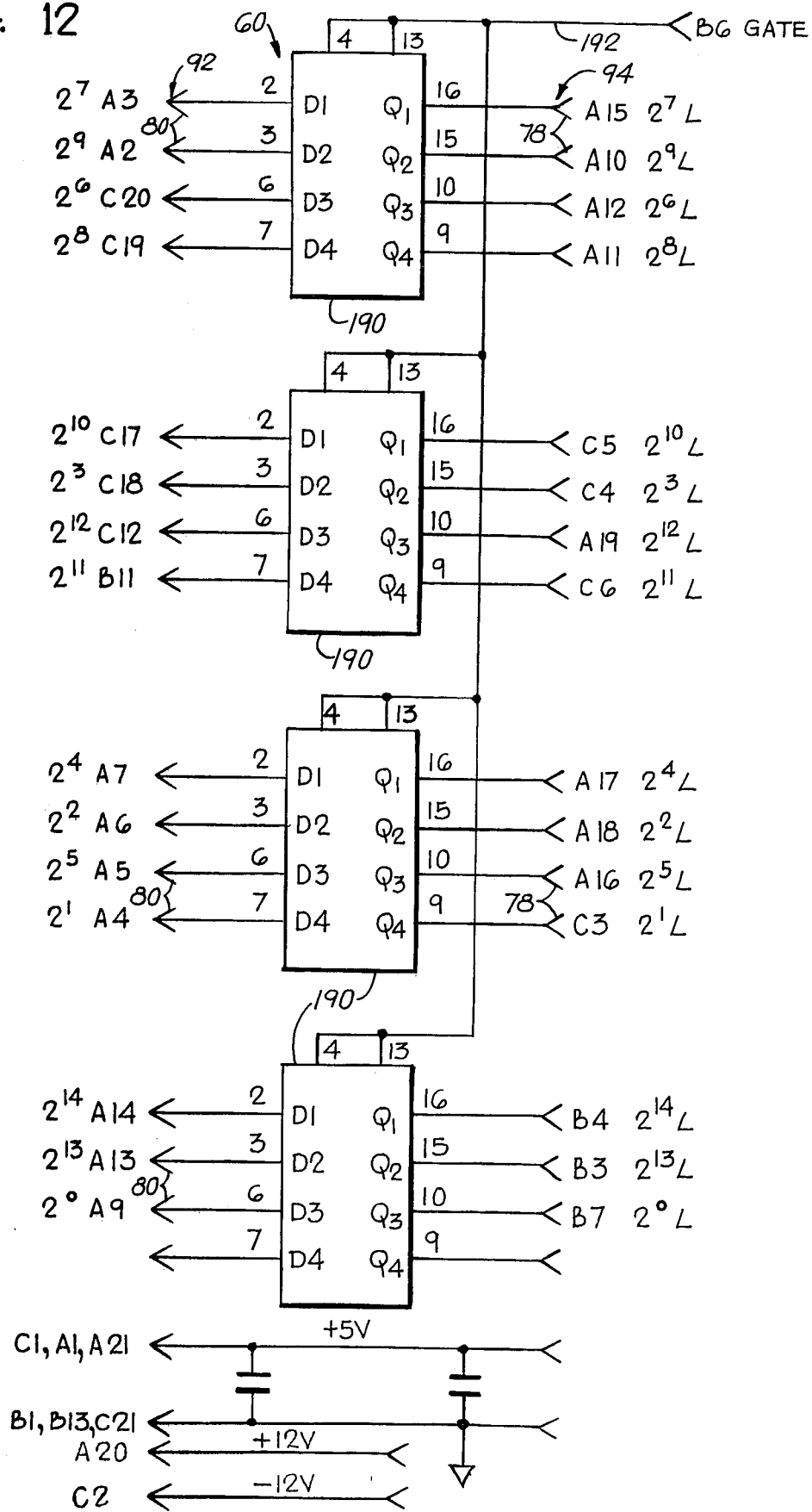
FIG. 12 is a schematic circuit diagram of a gate board for gating the multidigit electrical signals.

The board or module 60, shown in FIG. 12, is a gate board, for gating or latching the 15-bit signals, in response to a gating control signal.

Figure 14:
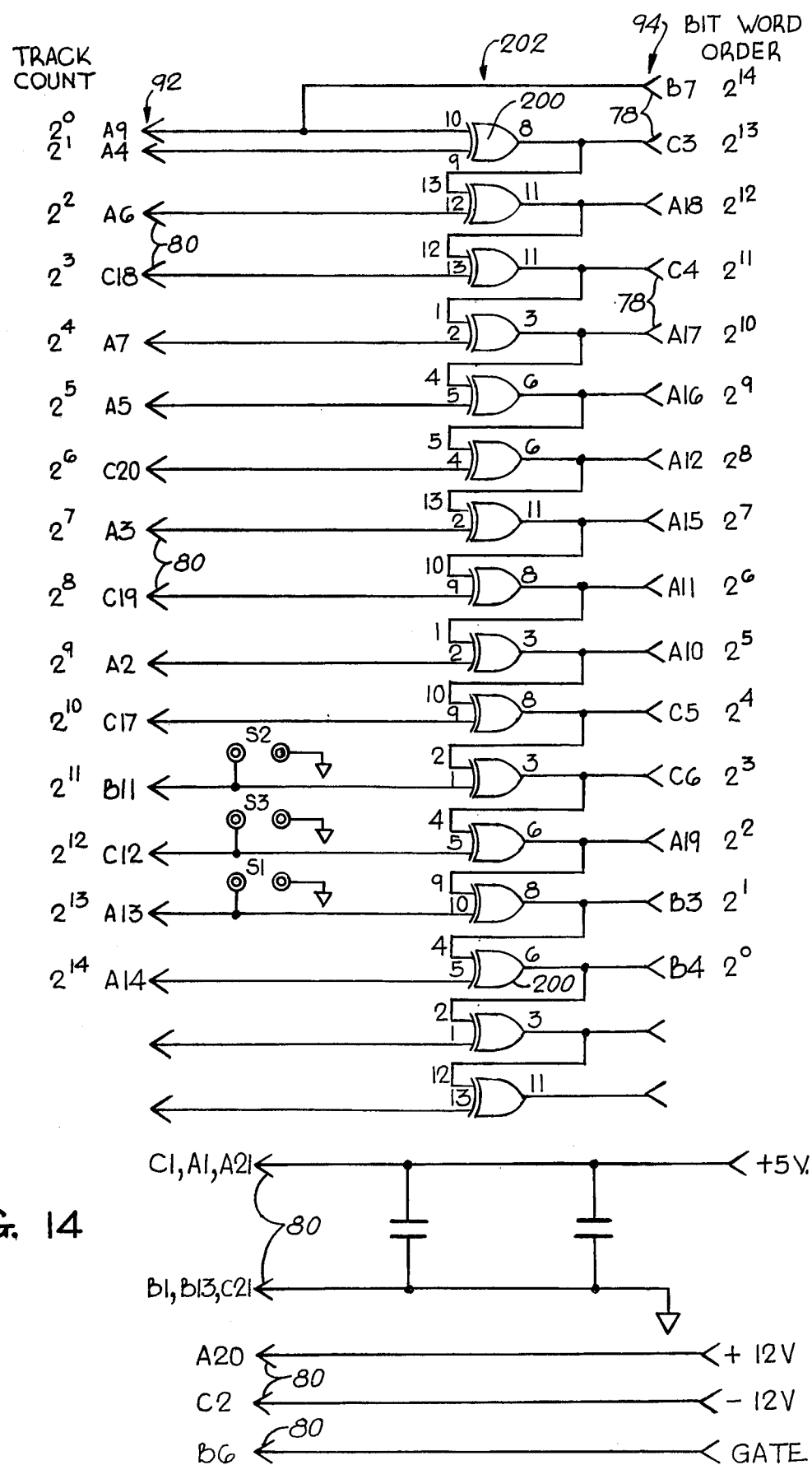
FIG. 14 is a schematic circuit diagram of a second or modified converter board which is similar to the converter board of FIG. 13, except that the two groups of signal channels are reversed between the input and the output.

The board or module 62, shown in FIG. 14, is a converter or decoder board, for converting the 15-bit Gray code signals to 15-bit natural binary code signals.

Figure 15:
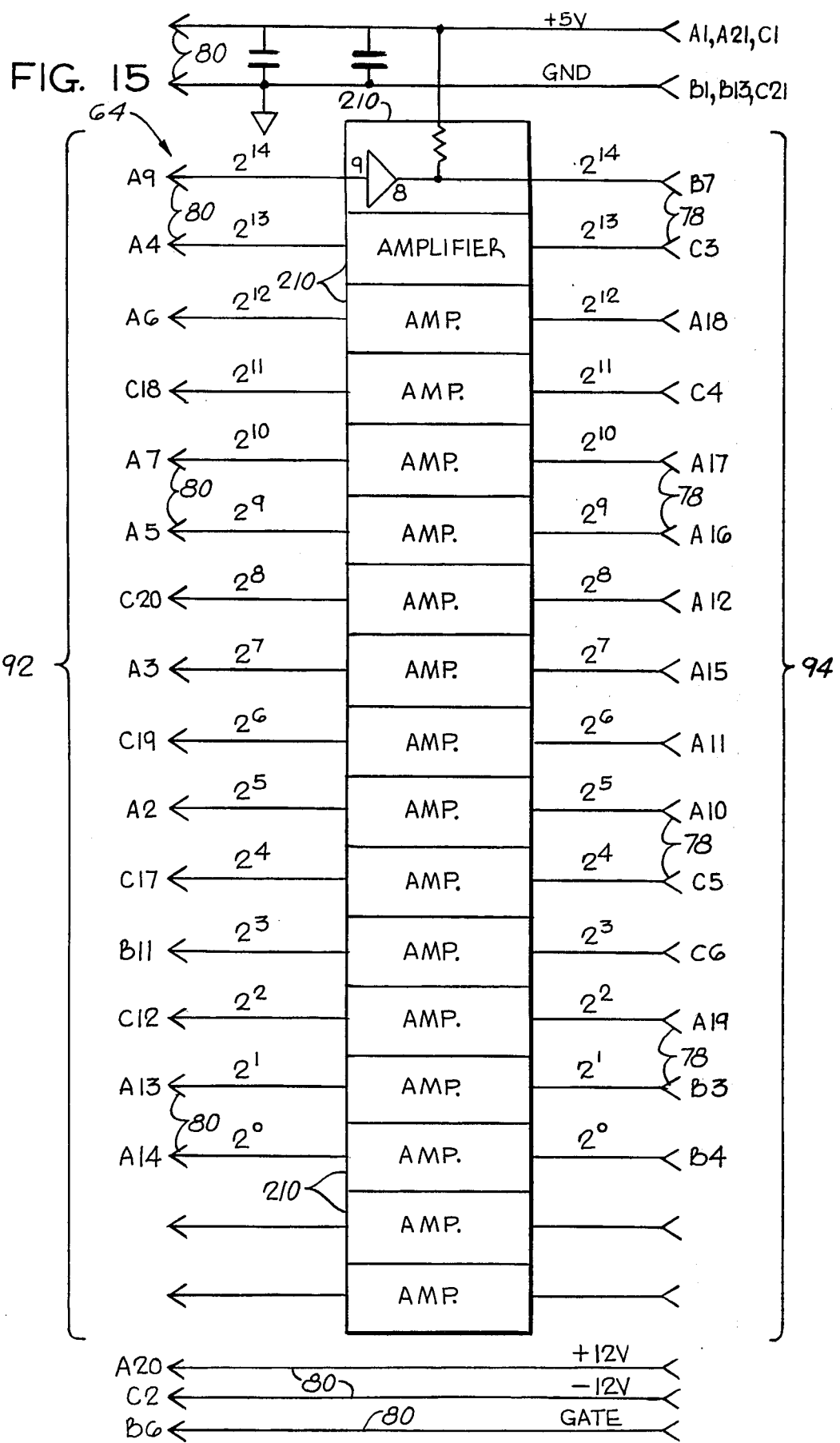
FIG. 15 is a schematic circuit diagram of a driver board, comprising driver amplifiers for amplifying the multi-digit code signals.

The board or module 64, shown in FIG. 15, is a driver board, for amplifying the 15-bit natural binary code signals, to provide amplified output signals.

The board or module 66, shown in FIG. 17, is a power supply board, for producing power at +12 volts and −12 volts, in addition to the input power at +5 volts. The 15-bit digital output signals are transmitted through the board 66 without change, for connection to the output connector 72 by leads 89.

It will be recalled that each of the boards 52–66 has 55 positions for the interconnecting sockets 78 and pin/sockets 80. The boards 52–66 include a common connection group 90 of such positions, such group 90 being employed for sockets 78 and pin/sockets 80 which provide common electrical connections to all or some of the boards 52–66. Such common connections may include power supply connections and one or more control signal connections. Generally, these power supply and control signal connections are plugged through all or some of the boards for supplying power supply voltages and control signals thereto.

As shown in FIG. 17, in connection with the power supply board 66, the common connection group 20 includes power supply connections designated +5 volts, ground, +12 volts and −12 volts. The common connection group 20 also includes a control signal connection designated GATE. As shown in FIG. 17, and also in the POWER SUPPLY column of FIGS. 20a and 20b, the power supply board 66 includes pin/sockets 80 at positions A1, A21 and C1 for +5 volts; at B1, B13 and C21 for GROUND; at A20 for +12 volts; at C2 for −12 volts; and at B6 for GATE.

The 55 interconnection positions also include two signal channel groups 92 and 94, shown, for example, in FIG. 15, in connection with the driver board 64, which has distinct input and output connections. The first signal channel group 92 provides the input connections to the driver board 64, while the second group 94 provides the output connections. As shown in FIG. 15, and also in the DRIVER column of FIGS. 20a and 20b, the first signal channel group 92 comprises pin/sockets 80 at positions A9, A4, A6, C18, A7, A5, C20, A3, C19, A2, C17, B11, C12, A13, and A14. The second signal channel group 94 comprises sockets 78 at the positions B7, C3, A18, C4, A17, A16, A12, A15, A11, A10, C5, C6, A19, B3, and B4.

As shown in FIG. 17 in connection with the power supply board 66, the second signal channel group 94 includes pin/sockets 80 which carry the multidigit signals through the power supply board 66. These pin/sockets plug into the corresponding sockets 78 of the second signal channel group on the driver board 64. The socket components 78 of the pin/sockets 80 on the power supply board are adapted to receive leads connected to corresponding contacts of the connector 72. Such connector contacts are tabulated in the CONNECTOR column of FIGS. 20a and 20b. The CONNECTOR column also tabulates the connector contacts which are connected to the pin/sockets 80 of the common connection group 90, comprising +5 volts, ground, +12 volts, −12 volts and GATE. One of the connector contacts, designated S, is also connected to a socket 78 designated CG, standing for CHASSIS GROUND, which is connected to the housing 38, by way of one of the posts 68.

As previously indicated, FIGS. 7-17 are schematic circuit diagrams of various modules or boards, adapted to be assembled to produce the encoder 30 and various other similar encoders. It may be advantageous to describe additional details of the modules or boards. It will be understood that the modules or boards are printed circuit boards on which various resistors, capacitors, integrated circuits and other components are mounted. The boards include printed circuits for establishing electrical connections between the various components, and also connections with the sockets 78 and pin/sockets 80.

As previously indicated, FIG. 7 illustrates the photocell board or module 52, which includes the multitrack photocell 50. In this case, the photocell 50 has 14 tracks which are numbered on FIG. 7, to receive the modulated light from 14 tracks on the optical code disc 40. Each track of the photocell 50 includes a photodetector 100, connected between the +5 volt terminal and an output channel or lead 102. A load resistor 104 is connected between each lead 102 and ground.

One of the tracks of the photocell 50, in this case track 9, receives unmodulated light from a blank or transparent track on the code disc 40, in order to generate a biasing or reference signal which is employed to balance out any variations in the level of the light produced by the light source 44. As shown in FIG. 7, the reference signal from the lead 102 is processed successively by a follower amplifier 106, a variable potentiometer 108 serving as a gain control, and another follower amplifier 110 having its output connected to an output channel or connection 112, on which the desired biasing or zero level voltage is developed. The reference or BRS channel 112 is connected to an output socket 78, at position C7 in this case.

As shown in FIG. 7, tracks 7 and 8 of the photocell 50 produce the sine and cosine signals, previously referred to, with a track resolution or count of $2^{11}$. The sine and cosine signals from tracks 7 and 8 are processed by follower amplifiers 114 and 115, having their outputs connected to sockets 78 at positions A8 and C16. It will be recalled that the position A8 is a member of the first signal group 92. The position C16 may be regarded as an extra member of the first signal group 92. In FIG. 7, the sine and cosine outputs are designated $\sin 2_{11}$ and $\cos 2^{11}$, to indicate that the track count or resolution of these signals is $2^{11}$.

As shown in FIG. 7, the other tracks 1–6 and 10–14 of the photocell 50 produce digital signals having track counts of $2^0$ through $2^{10}$. The digital signal from each of these tracks is processed by an individual trigger circuit 116 including an operational amplifier 118 having positive feedback to make the amplifier bistable. The amplifier 118 of each trigger circuit 116 receives its biasing voltage from the reference channel 112. Each trigger circuit 116 produces a digital output signal which is in the form of a definite square wave having a standardized magnitude, so that the output of the trigger circuit switches between a high state and a low state, representing 1 and 0. The outputs of the eleven trigger circuits 116 are labelled $2^0$ through $2^{10}$, to indicate the track count or resolution, and are connected to sockets 78 at positions A9, A4, A6, C18, A7, A5, C20, A3, C19, A2 and C17, which are members of the first signal group 92.

Figure 8:
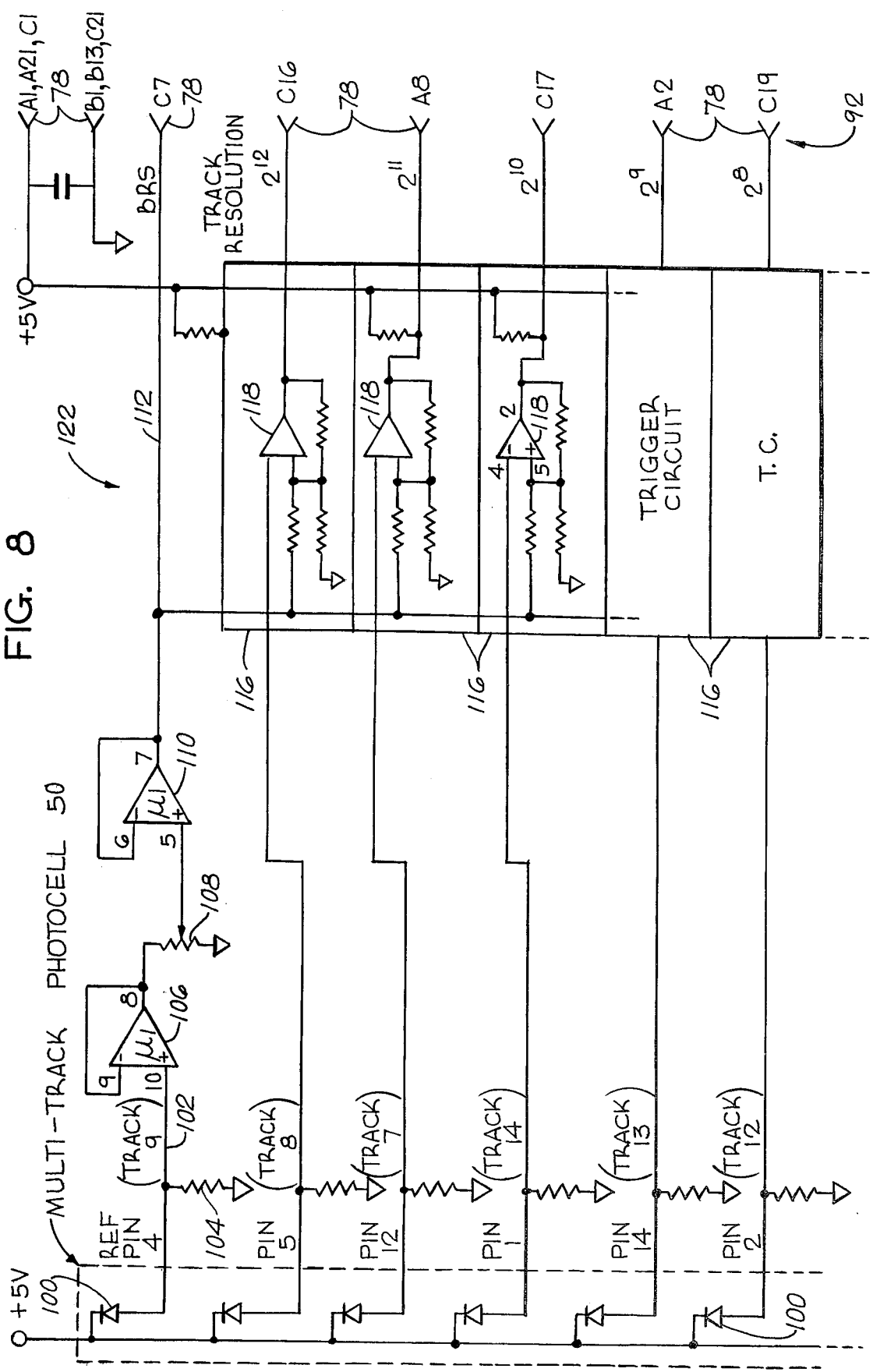
FIG. 8 is a fragmentary schematic circuit diagram of a modified photocell board, for producing thirteen bit code word electrical signals.

FIG. 8 illustrates a modified photocell board or module 122 which is the same as the photocell board 52 of FIG. 7, except that the sine and cosine tracks, having track numbers 7 and 8, are replaced with additional digital tracks having track counts of $2^{11}$ and $2^{12}$. Additional trigger circuits 116 are employed to process the additional digital signals. The outputs of the two additional trigger circuits 116 are labelled $2^{11}$ and $2^{12}$, to indicate the track count or resolution, and are connected to output sockets 78 at positions A8 and C16. The photocell board 122 of FIG. 8 thus produces a 13-bit digital output, encoded in accordance with the Gray code.

As previously indicated, FIG. 9 illustrates a multiplier board or module 54, adapted to multiply the frequency of sine and cosine inputs, designated sin x and cos x, by a factor of 2, to produce double frequency sine and consine outputs, designated sin 2x and cos 2x. The multiplier board or module 54 includes a dual multiplier circuit 126, adapted to multiply the frequency of the sine and cosine input signals. The multiplier circuit 126 may be constructed in accordance with the applicant's copending patent application, Ser. No. 202,166, filed Oct. 30, 1980, or may be of any other known or suitable construction. The multiplier circuit 126 is supplied with the sine and cosine inputs sin x and cos x, derived from the photocell board 52, by way of pin/sockets 80, mounted in positions A8 and C16. The sin x and cos x signals are the same as the signals labelled sin $2^{11}$ and cos $2^{11}$ in FIG. 7. The multiplier circuit 126 is also supplied with the biasing or reference signal BRS, by way of a pin/socket 80 mounted in the position C7.

The outputs of the multiplier circuit 126 provide double frequency sine and cosine signals, designated sin 2x and cos 2x, supplied to sockets 78 at positions A14 and C11. The multiplier circuit 126 also provides an inverted or not cos x output, supplied to a socket 78 at position B9. The multiplier circuit 126 is supplied with power at +12 volts and −12 volts from sockets 78 at positions A20 and C2, such power being derived from the power supply module 66 of FIG. 17, as previously indicated.

As shown in FIG. 9, the digital signal channels having track counts rating from $2^0$ through $2^{10}$ are fed through the multiplier board 54 by pin/sockets 80 at positions A9, A4, A6, C18, A7, A5, C20, A3, C19, A2, and C17, which are the same positions as listed in connection with the photocell board 52 of FIG. 7. The listed pin/sockets 80 of FIG. 9 plug into the corresponding sockets 78 of FIG. 7.

It will be understood that the multiplier board 54 of FIG. 9 may be employed to multiply the frequency of any pair of sine and cosine signals. Two or more of the multiplier boards 54 may be connected in cascade to provide successive stages of frequency multiplication, if desired.

FIG. 10, as previously indicated, illustrates the phase splitter board 56, which splits the phase of sine and cosine input signals, to produce signals having intermediate phases at angles of 22.5°, 45°, 67.5°, 112.5°, 135° and 157.5°. In this case, the phase splitter board 56 receives its sine and cosine inputs, designated sin 2x and cos 2x, from the outputs of the multiplier board 54, by way of pin/sockets 80 at positions A14 and C11, such pin/sockets being plugged into the corresponding sockets 78 of the multiplier board.

In the phase splitter 56 of FIG. 10, the sine input signal sin 2x is processed successively by a variable potentiometer 130, a negative feedback amplifier 132, and a phase inverting amplifier 134. Similarly, the cosine input signal cos 2x is processed successively by a variable potentiometer 136, a negative feedback amplifier 138 and a phase inverting amplifier 140. For balancing purposes, variable biasing voltages are supplied from the reference or BRS channel 112 to the amplifiers 132 and 138, by way of variable potentiometers 142 and 144. A biasing voltage for the phase inverting amplifiers 134 and 140 is supplied to a lead or line 146 by a voltage divider 148, connected between the +5 volt line and ground.

In the phase splitter 56 of FIG. 10, the output of the phase inverter 140 is at a phase angle of 0°, while the input is at a phase angle of 180°. The output of the other phase inverter 134 is at 90°, while the input is at 270°. These four quadrature voltages are supplied to a phase splitting circuit 150 which is illustrated in the form of a phase splitting resistor bridge circuit, having its four corners supplied with the four quadrature voltages. By appropriate selection of the values of the resistors employed in the bridge circuit, the taps are located so as to produce phase split output voltages or angles of 22.5°, 45°, 67.5°, 112.5°, 135°, and 157.5°, in addition to the four quadrature input voltages. Only the input voltage at 0° is used as an output. The output at 45° is used in its inverted form, which may be designated NOT 45° or $\overline{45°}$.

As shown in FIG. 10, the seven phase split outputs are processed by seven individual trigger circuits 160, each of which employs an amplifier 162 with positive feedback so that the amplifier is bistable, to produce a well defined square wave output at a standardized magnitude. Thus, the output of each trigger circuit 160 is switched between high and low states, representing 1 and 0. Each of the trigger circuits 160 has a pair of input terminals which are connected to a pair of opposite taps around the phase splitting bridge circuit 150. The inputs of the seven trigger circuits 160 are connected to appropriate taps to produce square wave outputs at angles of 0°, 22.5°, NOT or inverted 45°, 67.5°, 112.5°, 135°, and 157.5°, which are supplied to sockets 78 at positions C12, A10, A11, B10, C14, C13 and C15. It will be noted from the listing of FIG. 15 that the positions A10 and A11 are members of the second signal group 94. The other positions, B10, C14, C13, C15 and C12, may be regarded as extra members of the second signal group 94. The trigger circuits 160 of FIG. 10 receive biasing voltages from the line 146.

The phase splitter board 56 of FIG. 10 is followed by the logic board 58 of FIG. 11, which receives the phase split signals at 22.5°, NOT 45°, 67.5°, 112.5°, 135°, and 157.5°, by way of pin/sockets 80 at positions A10, A11, B10, C14, C15, and C13, adapted to plug into the correspondingly positioned sockets of FIG. 10. The six phase split signals are processed by a logic system comprising four exclusive OR gates 170, 172, 174 and 176. Specifically, the inputs designated NOT 45° and 135° are connected to the gate 170, which produces an output signal designated n cos 4x or $2^{13}$, supplied to a socket at position A13. This is a square output at a frequency which is four times the original cosine frequency from the photocell board 52, and twice the frequency of the cos 2x signal from the multiplier board 54. This output is equivalent to a direct digital output having a track count of $2^{13}$.

As shown in FIG. 11, the inputs designated 112.5° and 157.5° are supplied to the inputs of the gate 172. The inputs designated 67.5° and 22.5° are supplied to the inputs of the gate 174. The outputs of the gates 172 and 174 are supplied to the inputs of the gate 176, which provides an output signal designated n cos 8x or $2^{14}$, supplied to a socket 78 at the position A14. This is a square wave output at 8 times the original cosine frequency from the photocell board 52, and four times the output frequency 2x from the multiplier board 54. This output is equivalent to a digital output having a track count of $2^{14}$.

In the logic board 58 of FIG. 11, the signal designated NOT cos x received by way of a pin/socket 80 at the position B9, is processed by a diode 178, a load resistor 180, and a trigger circuit 182, which produces an output signal designated n cos x or $2^{11}$, supplied to a socket 78 at the position B11. This is a square wave signal at the same frequency as the original cosine signal from the photocell board 52 and is equivalent to a digital signal having a track count of $2^{11}$.

The signal at 0°, designated n cos 2x or $2_{12}$ in FIGS. 10 and 11, is transmitted through the logic board 58 by a pin/socket 80 at position C12. This signal is a square wave signal at twice the original cosine frequency, and is equivalent to a digital signal having a track count of $2^{12}$. The original digital signals designated $2^0$ through $2^{10}$ are fed through both the phase splitter board 56 of FIG. 10 and the logic board 58 of FIG. 11 by means of pin/sockets 80 at positions A9, A4, A6, C18, A7, A5, C20, A3, C19, A12, and C17, which are members of the first signal group 92, as will be seen from the listing of FIG. 15. The outputs at positions B11, C12, A13 and A14 are also members of the first signal group 92. Thus, both the feed through outputs and the independent outputs of the logic board 58 are at positions which are members of the first signal group 92. The independent inputs of the logic board 58 are at positions which are members of the second signal group 94.

As previously indicated, FIG. 12 illustrates a gate board or module 60, adapted to gate or latch the multi-digit binary signals. In this case, the gate board 60 comprises four quadruple gate modules 190 which may be in the form of commercially available integrated circuits. The four gate modules 190 provide sixteen channels, fifteen of which are employed to gate or latch the 15-bit digital signals from the logic board 58. The gate modules 190 are operative to gate or latch the digital signals, in response to control pulses or signals from the gate line 192, such gate signals being received by a socket 78 at the B6 position, previously referred to in connection with FIG. 17. In the gate board 60 of FIG. 12, the fifteen-bit digital signals are received from the logic board 58 by way of pin/sockets 80 at the positions designated A9, A4, A6, C18, A7, A5, C20, A3, C19, A2, C17, B11, C12, A13 and A14, which plug into the corresponding pin/sockets 80 and sockets 78 on the logic board 58. All of these positions are members of the first signal group 92, as listed in FIG. 15. The gated output signals for the track counts from $2^0$ through $2^{14}$ are supplied to sockets 78 at the positions designated B7, C3, A18, C4, A17, A16, A12, A15, A11, A10, C5, C6, A19, B3 and B4, all of which are members of the second signal group 94, as listed in FIG. 15.

Figure 13:
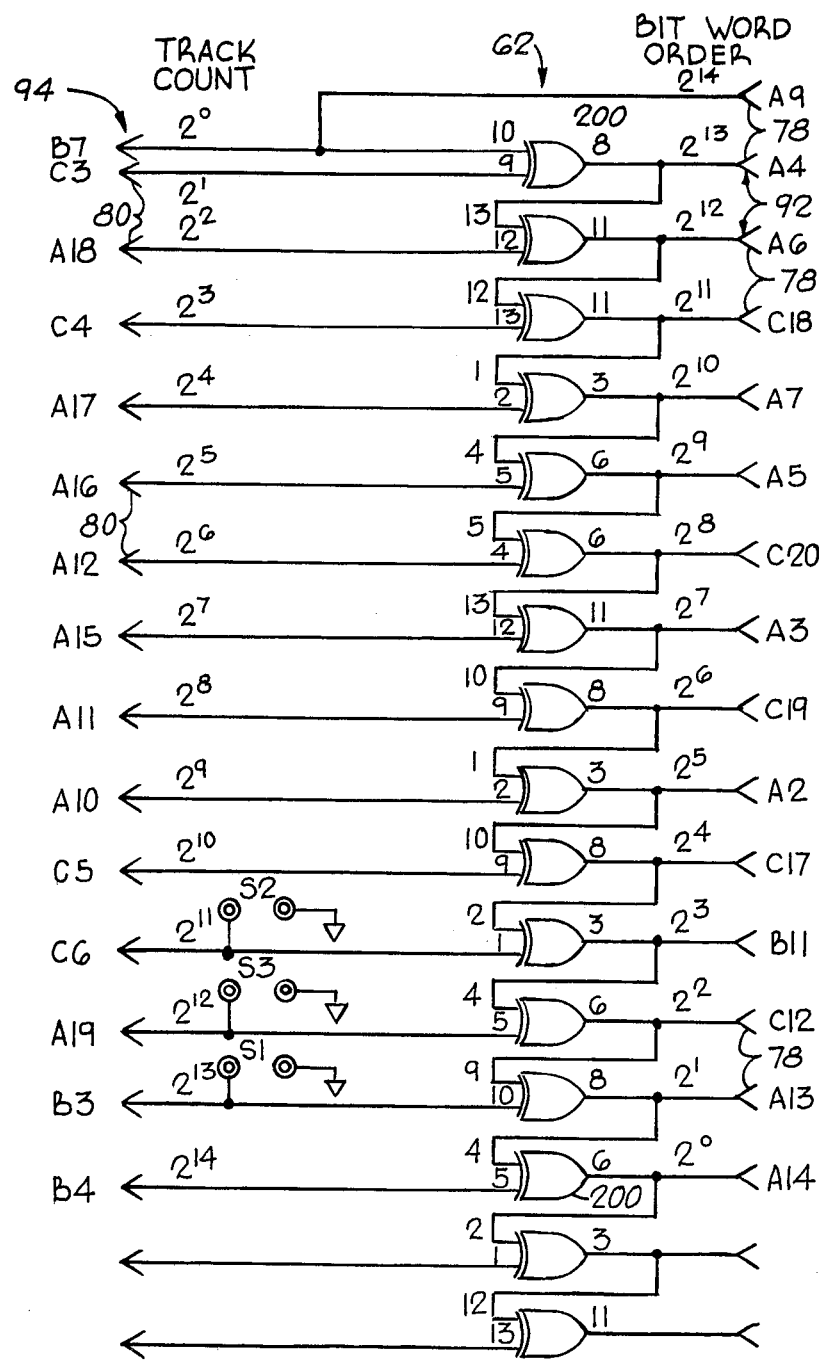
FIG. 13 is a schematic circuit diagram of a converter board for converting Gray code signals into natural binary code signals.
Figure 13:
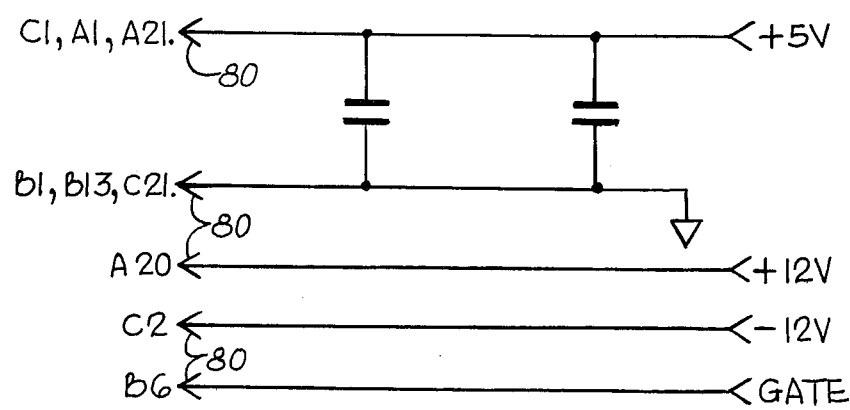

FIG. 13, as previously indicated, illustrates the converter or decoder board or module 62, which is employed to convert the Gray code binary signals into natural binary signals. As illustrated, the converter or decoder board 62 comprises a chain of sixteen exclusive OR gates 200, fourteen of which are employed in the 15-bit encoder 30. The other two gates 200 are extra elements, which give the converter board 66 a capability of handling seventeen bits, if needed.

In FIG. 13, the first fifteen inputs are labelled $2^0$ through $2^{14}$, indicating the track count or resolution, to correspond with the same labelling of the fifteen outputs of the preceding gate board 60 of FIG. 12. These fifteen inputs of the converter board 62 of FIG. 13 are connected to pin/sockets 80 at positions B7, C3, A18, C4, A17, A16, A12, A15, A11, A10, C5, C6, A19, B3 and B4. Such pin/sockets 80 are adapted to plug into the sockets 78 at the same positions on the gate board 60, as previously listed. These positions are members of the second signal group 94.

In the converter board 62 of FIG. 13, the first two inputs $2^0$ and $2^1$ are connected to the inputs of the first gate 200. The output of the first gate 200 is connected to one input of the second gate 200 in the chain. Similarly, the output of each other gate 200 is connected to one input of the following gate in the chain. The other signal inputs $2^2$ through $2^{14}$ are connected to the respective second inputs of the 2nd through the 14th gates 200 in the chain.

The converter board 62 of FIG. 13 has seventeen outputs, fifteen of which are employed for the 15-bit encoder 30. To agree with the table of FIGS. 20a and 20b, these fifteen outputs are labelled $2^0$ through $2^{14}$, in terms of the word order of the fifteen bit natural binary output word. The bit word order is opposite with respect to the track count order, employed in labelling the fifteen inputs. Thus, for example, the track count for the most significant input bit is $2^0$, while the bit word order for the corresponding most significant output bit is $2^{14}$. At the other end of the sequence, the track count for the least significant input bit is $2^{14}$, while the bit word order for the least significant output bit is $2^0$. The first output $2^{14}$ is connected directly to the first input $2^0$. The second output $2^{13}$ is connected to the output of the first gate 200 in the chain. The other successive outputs ranging from $2^{12}$ down to $2^0$ are connected to the outputs of the successive gates in the chain. The fifteen outputs, ranging from $2^{14}$ down through $2^0$, are connected to sockets 78 at the positions A9, A4, A6, C18, A7, A5, C20, A3, C19, A2, C17, B11, C12, A13 and A14, which are members of the first signal group 92.

FIG. 14 illustrates a modified converter or decoder board or module 202 which is the same as the converter board 62 of FIG. 13, except that the input and output positions are interchanged. Thus, the input positions of the modified converter board 202 are members of the first signal group 92, while the output positions are members of the second signal group 94. In making up various encoders, the first and second signal groups are employed alternately between certain boards, so that both kinds of boards are needed for maximum flexibility and interchangeability.

A previously indicated, FIG. 15 illustrates the driver board or module 64, which comprises seventeen driver amplifiers 210, fifteen of which are employed for the fifteen bit encoder 30. The amplifiers 210 may utilize integrated circuits. As previously indicated, the inputs of the amplifiers are connected to pin sockets 80 at the previously listed positions which are members of the first signal channel group 92, such pin/sockets 80 being adapted to be plugged into the corresponding sockets 78 of the converter board 62, shown in FIG. 13. The outputs of the amplifiers 210 are connected to sockets 78 at the previously listed positions which are members of the second signal channel group 94. The input and output positions are labelled in FIG. 15 in accordance with the bit word order from $2^{14}$ down through $2^0$, in agreement with the chart of FIGS. 20a and 20b.

FIG. 16 illustrates a modified driver board or module 212, which is the same as the driver board 64 of FIG. 15, except that the input and output positions are interchanged. As previously pointed out, it is advantageous to provide these two kinds of driver boards, for maximum flexibility and versatility in assembling various encoders.

FIG. 17, as previously indicated, illustrates the power supply board 66, which includes an integrated circuit 220, which may be of a commercially available type, for deriving power supply outputs at +12 volts and −12 volts from an input power source at +5 volts. The power supply board 66 has a multiplicity of pin/sockets 80 which carry the fifteen bit binary electrical signals through the board, unchanged. Such pin/sockets 80 are mounted on the board 66 in the previously listed positions of the second signal channel group 94. As tabulated in the interconnection chart of FIGS. 20a and 20b, the pin sockets 80 of the power supply board 66 plug into the corresponding sockets 78 on the driver board 64. The leads 89 to the various contacts of the connector 72 plug into the corresponding sockets 80 on the power supply board 66.

As already indicated, FIGS. 20a and 20b, taken together, constitute a complete interconnection chart for the 15-bit encoder of FIG. 1. The positions of the sockets 78 and pin sockets 80 are given in this chart for all of the inputs and the outputs of all of the boards or modules 52–66, and also for the connector 72, in the encoder 30.

Many different encoders may be produced by assembling various combinations of the encoder boards or modules. Referring to the 15-bit encoder represented in FIGS. 20a and 20b, some of the modules may be omitted if less complex encoders are needed. If a 14-bit encoder is needed, the multiplier board or module 54 may be omitted. On the other hand, if a 16-bit encoder is needed, a second multiplier board may be employed in cascade with the first multiplier board 54.

If a 13-bit encoder is needed, the phase splitter board 56 and the logic board 58 may be omitted. If the gating or latching function is not needed, the gate board 60 may be omitted. If a Gray code output is needed, the converter or decoder board 62 may be omitted. If amplification of the output signals is not needed, the driver board 64 may be omitted. If the multiplier board 54 is omitted, the power supply board 66 may also be omitted. Various connectors of different types may be employed, as desired.

FIGS. 18a and 18b constitute an interconnection chart for a much simpler 13-bit encoder having a direct Gray code output. This encoder comprises only the modified photocell board 122 of FIG. 8, which provides a 13-bit digital output, utilizing the Gray code. The 13-bit output is supplied directly to a connector, which may be similar to the connector 72.

FIGS. 19a and 19b constitute an interconnection chart for a 10-bit encoder having a natural binary output. This encoder employs the modified photocell board 122 of FIG. 8, having a 13-bit Gray code output, the modified converter or decoder board 202 of FIG. 14, for converting the Gray code binary signals to natural binary signals, and the modified driver board 212 of FIG. 16, plus a connector similar to the connector 72. The modified converter board 202 and the modified driver board 212 are employed because their input and output signal connections fit into the sequence of the boards. Thus, the sockets 78 and pin/sockets 80 which plug into one another between the photocell board 122 and the converter board 202 ar located in positions of the first signal group 92. The sockets 78 and pin/sockets 80 between the converter board 202 and the driver board 212 are located in the positions of the second signal group 94. The sockets 78 for the output signals from the driver board 212 are located in the positions of the first signal group 92. The encoder represented by FIGS. 19a and 19b is a further illustration of the alternate use of the two signal groups 92 and 94 in carrying the signals between the adjacent boards or modules.

I claim:

1. An optical encoder, comprising
a housing,
light source means in said housing,
an optical code member movably mounted in said housing and having a multiplicity of tracks for modulating the light from said light source means,
multitrack photocell means for receiving the modulated light from said code member,
said photocell means having a multiplicity of signal channels for supplying a multiplicity of electrical signals indicating the movement of said code member,
at least first and second circuit boards mounted on said housing in successively stacked relation,
said circuit boards including processing means for processing the signals from said photocell means,
and a multiplicity of sockets and pins mounted on said boards and plugged into one another for establishing electrical connections between the successive boards,
each of said boards having a multiplicity of matching positions for selectively receiving said sockets and pins,
said boards having a common connection group comprising a plurality of said positions for receiving sockets and pins for establishing certain electrical connections extending in common to all of said stacked boards,
said common connection group including electrical connections for supplying electrical power to said stacked boards,
said boards including at least first and second signal channel groups of said positions for receiving sockets and pins for transmitting the multiplicity of electrical signals of the signal channels between successive boards,
said circuit boards including certain of said circuit boards including input connections to said processing means thereon afforded by mated sockets and pins in positions of one of said first and second signal channel groups and including additional mated sockets and pins in positions of the other of said first and second signal channel groups affording output connections from said last mentioned processing means whereby said first and second signal channel groups are employed alternately.

2. An encoder according to claim 1,
said circuit boards including at least one board having sockets combined with pins for carrying signals unchanged past said one board,
said sockets combined with pins being received in positions of one of said first and second signal channel groups.

3. An optical encoder, comprising
a housing,
light source means in said housing,
an optical code member movably mounted in said housing and having a multiplicity of tracks for modulating the light from said light source means,
multitrack photocell means for receiving the modulated light from said code member,
said photcell means having a multiplicity of signal channels for supplying a multiplicity of electrical signals indicating the movement of said code member,
at least first and second circuit boards mounted on said housing in successively stacked relation,
said circuit boards including processing means for processing the signals from said photocell means,
and a multiplicity of sockets and pins mounted on said boards and plugged into one another for establishing electrical connections between the sucessive boards, each of said boards having a multiplicity of matching positions for selectively receiving said sockets and pins, said boards having a common connection group comprising a plurality of said positions for receiving sockets and pins for establishing certain electrical connections extending in common to all of said stacked boards, said common connection group including electrical connections for supplying electrical power to said stacked boards, said boards including at least first and second signal channel groups of said positions for receiving sockets and pins for transmitting the multiplicity of electrical signals of the signal channels between successive boards, said circuit boards including a particular circuit board having a plurality of input pins received in said positions of said first signal channel group for supplying input signals to said processing means on said particular circuit board, said input pins being removably plugged into corresponding output sockets on the preceding board in the stack, said particular board having a plurality of output sockets received in said positions of said second signal channel group for receiving output signals from said processing means on said particular circuit board, said last mentioned output sockets removably receiving corresponding input pins on the next board in the stack.

4. An encoder according to claim 3, said circuit boards including another circuit board having a plurality of input pins received in said positions of said second signal channel group for supplying input signals to said processing means on said other circuit board, said input pins being removably plugged into corresponding output sockets on the preceding board in the stack, said other board having a plurality of output sockets received in said positions of said first signal channel group for receiving output signals from said processing means on said other circuit board, said last mentioned output sockets removably receiving corresponding input pins on the next board in the stack.

5. An encoder according to claim 3, said circuit boards including at least one circuit board having a plurality of input pins combined with output sockets and received in some of said positions of one of said first and second signal channel groups for transmitting signals unchanged between said combined pins and sockets, said one circuit board having additional input pins received in other of said positions of said one of said first and second signal channel groups for supplying input signals to said processing means on said one circuit board, said pins on said one circuit board being removably plugged into corresponding output sockets on the preceding board in the stack, said one board having a plurality of additional output sockets received in positions of the other of said first and second signal channel groups for receiving output signals from said processing means on said one circuit board, said output sockets on said one circuit board removably receiving corresponding input pins on the next board in the stack.

6. An optical encoder, comprising a housing, light source means in said housing, an optical code member movably mounted in said housing and having a multiplicity of tracks for modulating the light from said light source means, multitrack photocell means for receiving the modulated light from said code member, said photocell means having a multiplicity of signal channels for supplying a multiplicity of electrical signals indicating the movement of said code member, at least first and second circuit boards mounted on said housing in successively stacked relation, said circuit boards including processing means for processing the signals from said photocell means, and a multiplicity of sockets and pins mounted on said boards and plugged into one another for establishing electrical connections between the successive boards, each of said boards having a multiplicity of matching positions for selectively receiving said sockets and pins, said boards having a common connection group comprising a plurality of said positions for receiving sockets and pins for establishing certain electrical connections extending in common to all of said stacked boards, said common connection group including electrical connections for supplying electrical power to said stacked boards, said boards including at least first and second signal channel groups of said positions for receiving sockets and pins for transmitting the multiplicity of electrical signals of the signal channels between successive boards, said photocell means and said first circuit board including a plurality of sockets and pins removably plugged together and received in said positions of said first signal channel group for carrying signals from said photocell means to afford input signals to said processing means on said first circuit board, said first and second circuit boards having a plurality of said sockets and pins removably plugged together and received in said positions of said second signal channel group for carrying output signals from said processing means on said first circuit board to afford input signals to said processing means on said second circuit board.

7. An optical encoder, comprising a housing, light source means in said housing, an optical code member movably mounted in said housing and having a multiplicity of tracks for modulating the light from said light source means, multitrack photocell means for receiving the modulated light from said code member, said photocell means having a multiplicity of signal channels for supplying a multiplicity of electrical signals indicating the movement of said code member, at least first and second circuit boards mounted on said housing in successively stacked relation, said circuit boards including processing means for processing the signals from said photocell means, and a multiplicity of sockets and pins mounted on said boards and plugged into one another for establishing electrical connections between the successive boards, each of said boards having a multiplicity of matching positions for selectively receiving said sockets and pins, said boards having a common connection group comprising a plurality of said positions for receiving sockets and pins for establishing certain electrical connections extending in common to all of said stacked boards, said common connection group including electrical connections for supplying electrical power to said stacked boards, said boards including first and second signal channel groups of said positions for receiving sockets and pins for transmitting the multiplicity of electrical signals of the signal channels between successive boards, said first and second signal channel groups being employed alternately for receiving said sockets and pins to carry the signals to and from certain of said circuit boards, said photocell means including a plurality of said sockets received in said positions of said first signal channel group for receiving signals from said photocell means, said first circuit board including a plurality of pins removably plugged into said last mentioned sockets on said photocell means for carrying the signals from said photocell means to afford input signals to said processing means on said first circuit board, said first circuit board having a plurality of said sockets received in said positions of said second signal channel group for receiving output signals from said processing means on said first circuit board, said second circuit board having a plurality of pins removably plugged into said last mentioned sockets on said first circuit board for carrying said output signals to said processing means on said second circuit board.

* * * * *